(12) United States Patent
Tsutsumi

(10) Patent No.: US 9,716,105 B1
(45) Date of Patent: Jul. 25, 2017

(54) THREE-DIMENSIONAL MEMORY DEVICE WITH DIFFERENT THICKNESS INSULATING LAYERS AND METHOD OF MAKING THEREOF

(71) Applicant: SANDISK TECHNOLOGIES LLC, Plano, TX (US)

(72) Inventor: Masanori Tsutsumi, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/226,132

(22) Filed: Aug. 2, 2016

(51) Int. Cl.
| | |
|---|---|
| H01L 27/115 | (2017.01) |
| H01L 23/522 | (2006.01) |
| H01L 29/792 | (2006.01) |
| H01L 21/768 | (2006.01) |
| H01L 27/11582 | (2017.01) |

(Continued)

(52) U.S. Cl.
CPC .... *H01L 27/11582* (2013.01); *H01L 21/0217* (2013.01); *H01L 21/02164* (2013.01); *H01L 21/28273* (2013.01); *H01L 21/28282* (2013.01); *H01L 21/31111* (2013.01); *H01L 21/324* (2013.01); *H01L 23/528* (2013.01); *H01L 23/5226* (2013.01); *H01L 27/1157* (2013.01); *H01L 27/11521* (2013.01); *H01L 27/11524* (2013.01); *H01L 27/11526* (2013.01); *H01L 27/11529* (2013.01); *H01L 27/11556* (2013.01); *H01L 27/11568* (2013.01);

(Continued)

(58) Field of Classification Search
CPC ......... H01L 27/11524; H01L 27/11529; H01L 27/1157; H01L 27/11582; H01L 27/11556; H01L 27/11521; H01L 27/11526; H01L 27/11573; H01L 27/11568; H01L 23/528; H01L 23/5226; H01L 29/0847; H01L 29/1037; H01L 21/0217; H01L 21/324; H01L 21/31111; H01L 21/28282; H01L 21/28273; H01L 21/02164
USPC ............ 257/314, 324, 326, E21.69, E21.614
See application file for complete search history.

(56) References Cited

U.S. PATENT DOCUMENTS

| | | |
|---|---|---|
| 5,915,167 A | 6/1999 | Leedy |
| 8,349,681 B2 | 1/2013 | Alsmeier et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Dao H Nguyen
(74) *Attorney, Agent, or Firm* — The Marbury Law Group PLLC

(57) ABSTRACT

A three-dimensional memory device includes an alternating stack of insulating layers and electrically conductive layers located over a substrate, memory stack structures including a memory film and a vertical semiconductor channel and extending through a first region of the alternating stack, and support pillar structures extending through a second region of the alternating stack that is laterally offset from the first region. Each insulating layer includes a respective first insulating material portion having a respective first insulator thickness in the first region of the alternating stack and a respective second insulating material portion having a respective second insulator thickness that is greater than the respective first insulator thickness in the second region.

12 Claims, 22 Drawing Sheets

(51) Int. Cl.

| | | |
|---|---|---|
| *H01L 27/11556* | (2017.01) | |
| *H01L 23/528* | (2006.01) | |
| *H01L 29/08* | (2006.01) | |
| *H01L 29/10* | (2006.01) | |
| *H01L 27/11521* | (2017.01) | |
| *H01L 27/11526* | (2017.01) | |
| *H01L 27/11568* | (2017.01) | |
| *H01L 27/11573* | (2017.01) | |
| *H01L 21/324* | (2006.01) | |
| *H01L 21/311* | (2006.01) | |
| *H01L 21/28* | (2006.01) | |
| *H01L 21/02* | (2006.01) | |
| *H01L 27/1157* | (2017.01) | |
| *H01L 27/11529* | (2017.01) | |
| *H01L 27/11524* | (2017.01) | |

(52) U.S. Cl.
CPC .... *H01L 27/11573* (2013.01); *H01L 29/0847* (2013.01); *H01L 29/1037* (2013.01)

(56) References Cited

U.S. PATENT DOCUMENTS

| | | | |
|---|---|---|---|
| 8,709,894 | B2 | 4/2014 | Lee et al. |
| 8,987,805 | B2 | 3/2015 | Nam et al. |
| 9,023,719 | B2 | 5/2015 | Pachamuthu et al. |
| 9,136,130 | B1 | 9/2015 | Wada et al. |
| 9,230,974 | B1 | 1/2016 | Pachamuthu et al. |
| 9,230,979 | B1 | 1/2016 | Pachamuthu et al. |
| 9,236,396 | B1 | 1/2016 | Koka et al. |
| 9,305,849 | B1 | 4/2016 | Tsutsumi et al. |
| 9,305,932 | B2 | 4/2016 | Kanakamedala et al. |
| 9,305,937 | B1 | 4/2016 | Tsutsumi et al. |
| 9,356,031 | B2 | 5/2016 | Lee et al. |
| 9,379,132 | B2 | 6/2016 | Koka et al. |
| 9,484,357 | B2 * | 11/2016 | Makala .............. H01L 27/11582 |
| 9,576,975 | B2 * | 2/2017 | Zhang ............... H01L 27/11582 |
| 2012/0001252 | A1 | 1/2012 | Alsmeier et al. |
| 2012/0299076 | A1 | 11/2012 | Yoo et al. |
| 2014/0054676 | A1 | 2/2014 | Nam et al. |
| 2014/0284695 | A1* | 9/2014 | Won ..................... H01L 29/7926 257/324 |
| 2014/0353738 | A1 | 12/2014 | Makala et al. |
| 2015/0008505 | A1 | 1/2015 | Chien et al. |
| 2015/0076584 | A1 | 3/2015 | Pachamuthu et al. |
| 2015/0179660 | A1 | 6/2015 | Yada et al. |
| 2015/0179662 | A1 | 6/2015 | Makala et al. |
| 2016/0035742 | A1 | 2/2016 | Kanakamedala et al. |
| 2016/0064532 | A1 | 3/2016 | Makala et al. |
| 2016/0086972 | A1 | 3/2016 | Zhang et al. |
| 2016/0172366 | A1 | 6/2016 | Koka et al. |
| 2016/0172370 | A1 | 6/2016 | Makala et al. |
| 2016/0211272 | A1 | 7/2016 | Koka et al. |
| 2016/0293623 | A1* | 10/2016 | Simsek-Ege ...... H01L 27/11582 |
| 2017/0062472 | A1* | 3/2017 | Park .................. H01L 27/11582 |

OTHER PUBLICATIONS

Chen, R. et al., "Chemistry for Positive Pattern Transfer Using Area-Selective Atomic Layer Deposition," Advanced Materials, vol. 18, pp. 1086-1090, (2006).

Moshe, H. et al., "Atomic Layer Deposition on Self-Assembled Monolayers," Materials Science—Advanced Topics, Chapter 3, pp. 63-84, (2013).

Spencer, D. F., Nnun Workshop on Electron Beam Lithography for Nanostructure Fabrication, Presentation Titles, "Resist & Resist Processing," Cornell Nanofabrication Facility, Cornell University, Ithaca, NY, 15 pages, (Jan. 14-15, 2002).

Dumas, P. et al., "Electron-Energy-Loss Characterization of the H-Terminated Si(111) and Si(100) Surfaces Obtained by Etching in $NH_4F$," Chemical Physics Letters, vol. 181, No. 6, pp. 537-543, (1991).

Kobayashi, N. P. et al., "Two-Stage Atomic Layer Deposition of Smooth Aluminum Oxide on Hydrophobic Self-Assembled Monolayers," Engineering Letters, vol. 16, No. 2, 6 pages, (2008).

Wang, M. et al., "Self-Assembled Silane Monolayers: Fabrication with Nanoscale Uniformity," Langmuir, vol. 21, pp. 1848-4857, (2005).

Dong, W. et al., "Application of Three-Dimensionally Area-Selective Atomic Layer Deposition for Selective Coating the Vertical Surfaces of Standing Nanopillars," Scientific Reports, vol. 4, pp. 1-4, (2014).

Sung, M. M. et al., "Formation of Alkylsiloxane Self-Assembled Monolayers on $Si_3N_4$," J. Vac. Sci. Technol. A, vol. 17, No. 2, pp. 540-544, (1999).

Knez, M. et al., "Synthesis and Surface Engineering of Complex Nanostructures by Atomic Layer Deposition," Adv. Mater., vol. 19, pp. 3425-3438, (2007).

Li, M., "Modification of Silicon by Self-Assembled Monolayers for Application in Nano-Electronics and Biology," Dissertation Submitted to the Graduate School-New Brunswick, Rutgers, The State University of New Jersey for Degree of Doctor of Philosophy, 195 pages, (2007).

Invitation to Pay Additional Fees and Communication Relating to the Results of the Partial International Search for PCT/US2015/053841, 9 pages, dated Dec. 21, 2015.

International Search Report and Written Opinion of International Searching Authority for PCT/US2015/053841, 19 pages, dated Feb. 24, 2016.

U.S. Appl. No. 14/804,564, filed Jul. 21, 2015, SanDisk Technologies, Inc.

U.S. Appl. No. 14/921,385, filed Oct. 23, 2015, SanDisk Technologies, Inc.

* cited by examiner

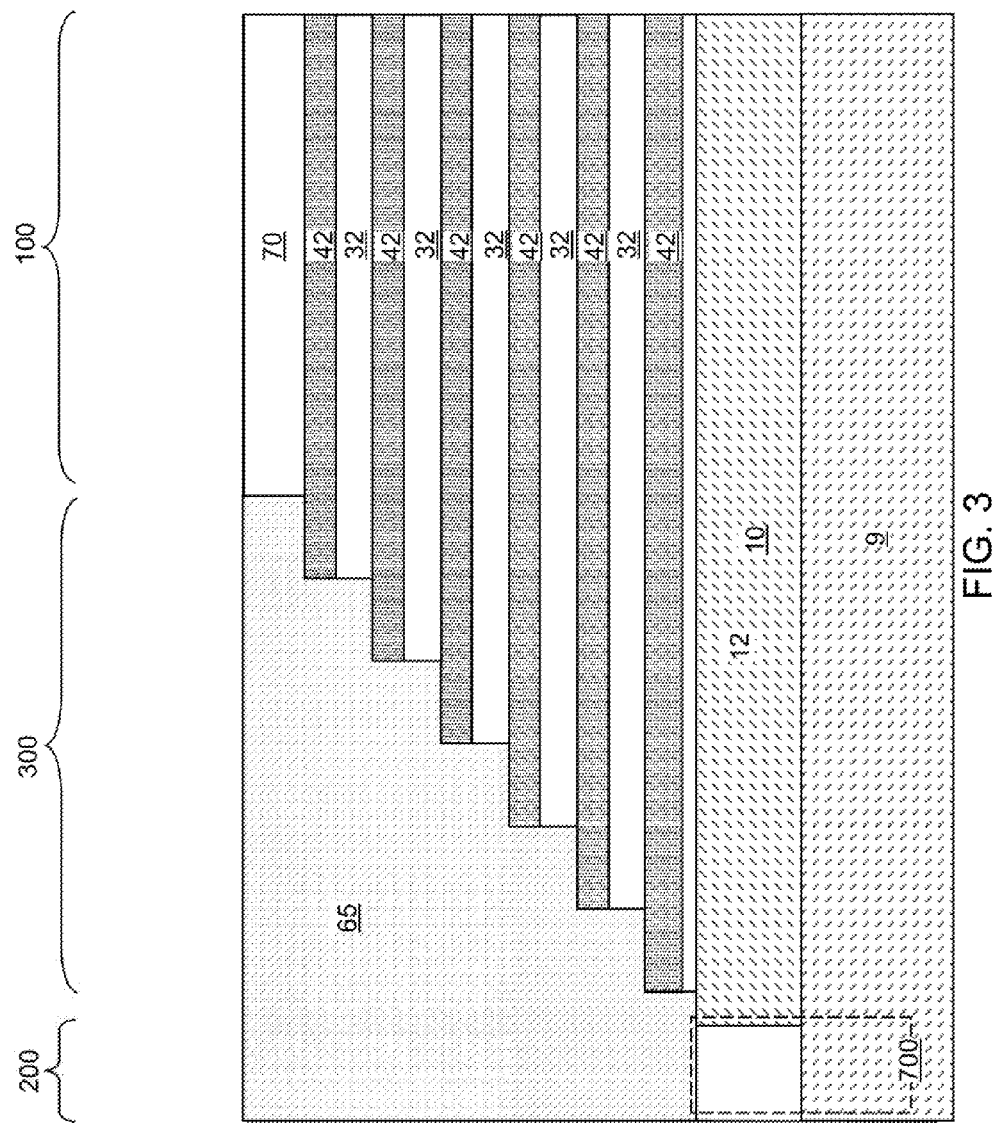

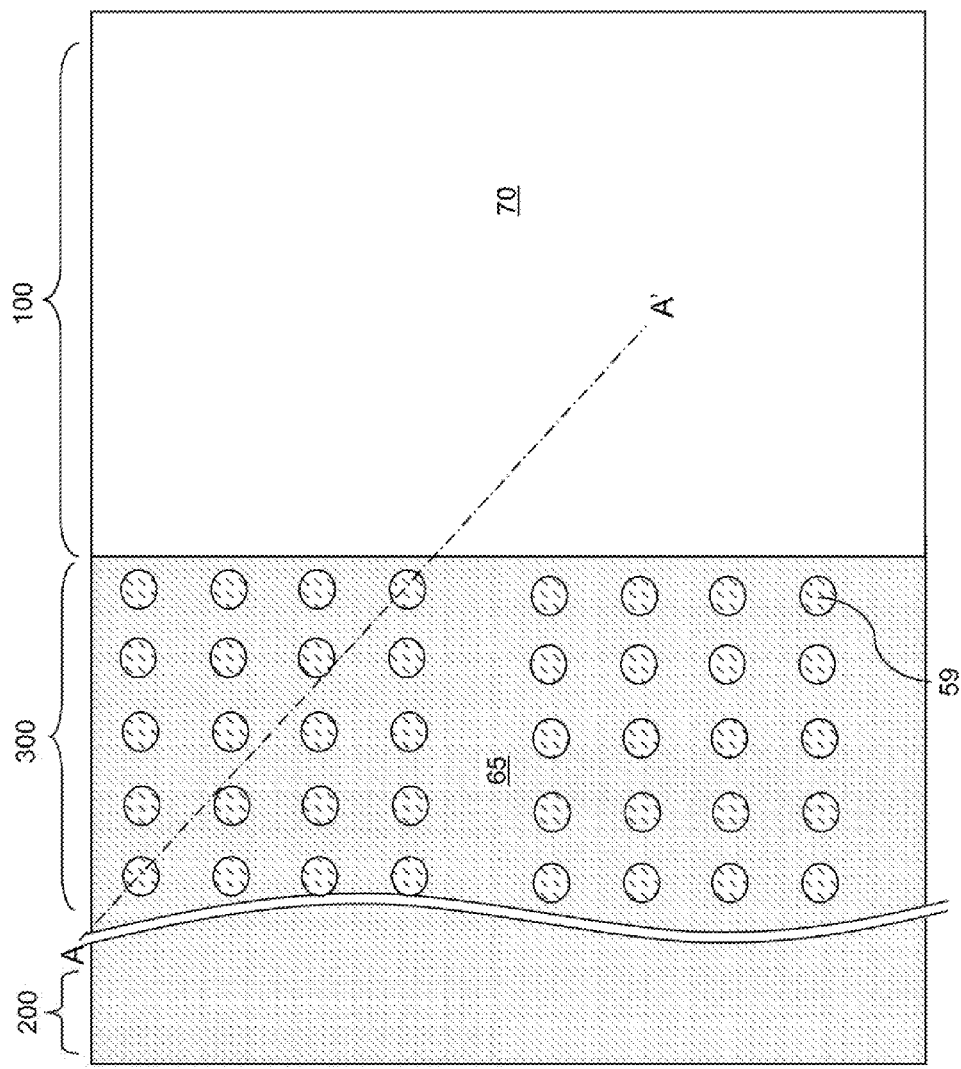

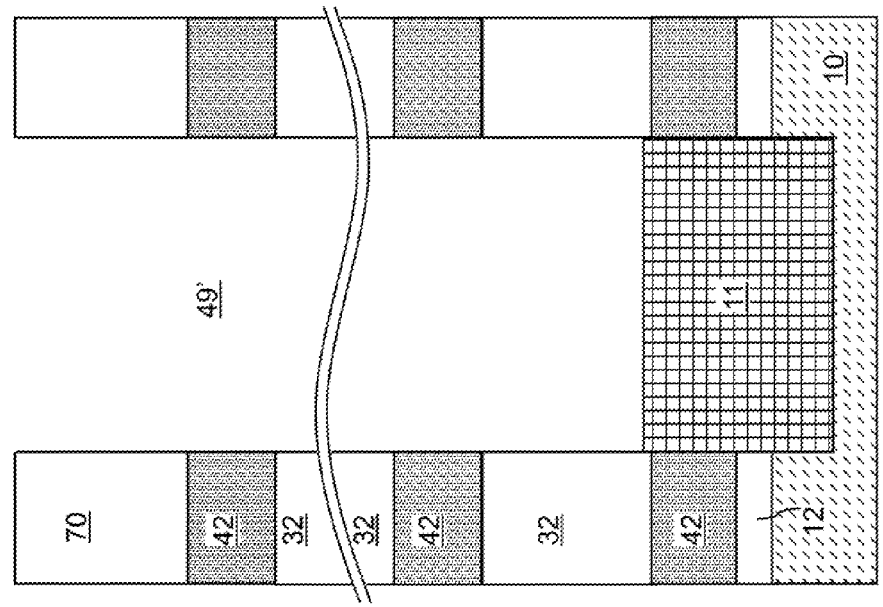
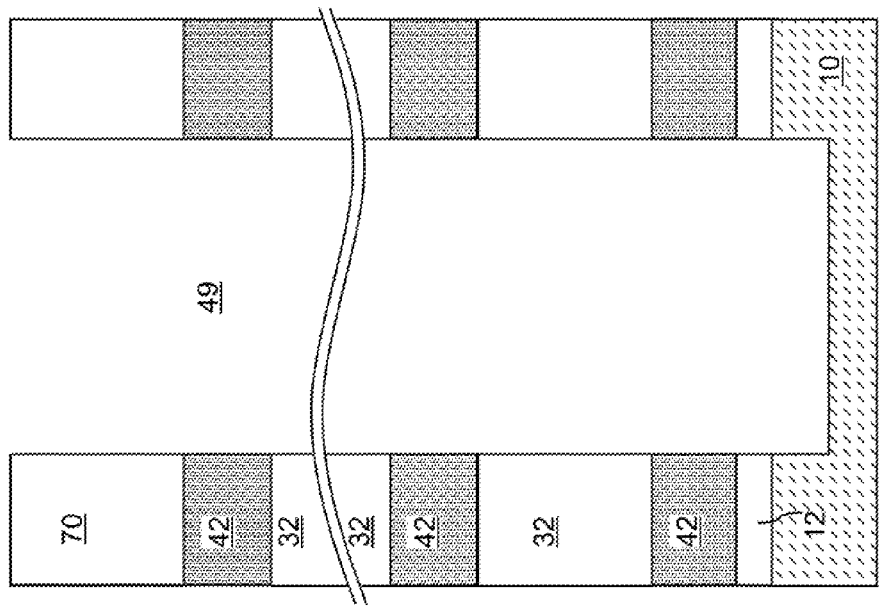

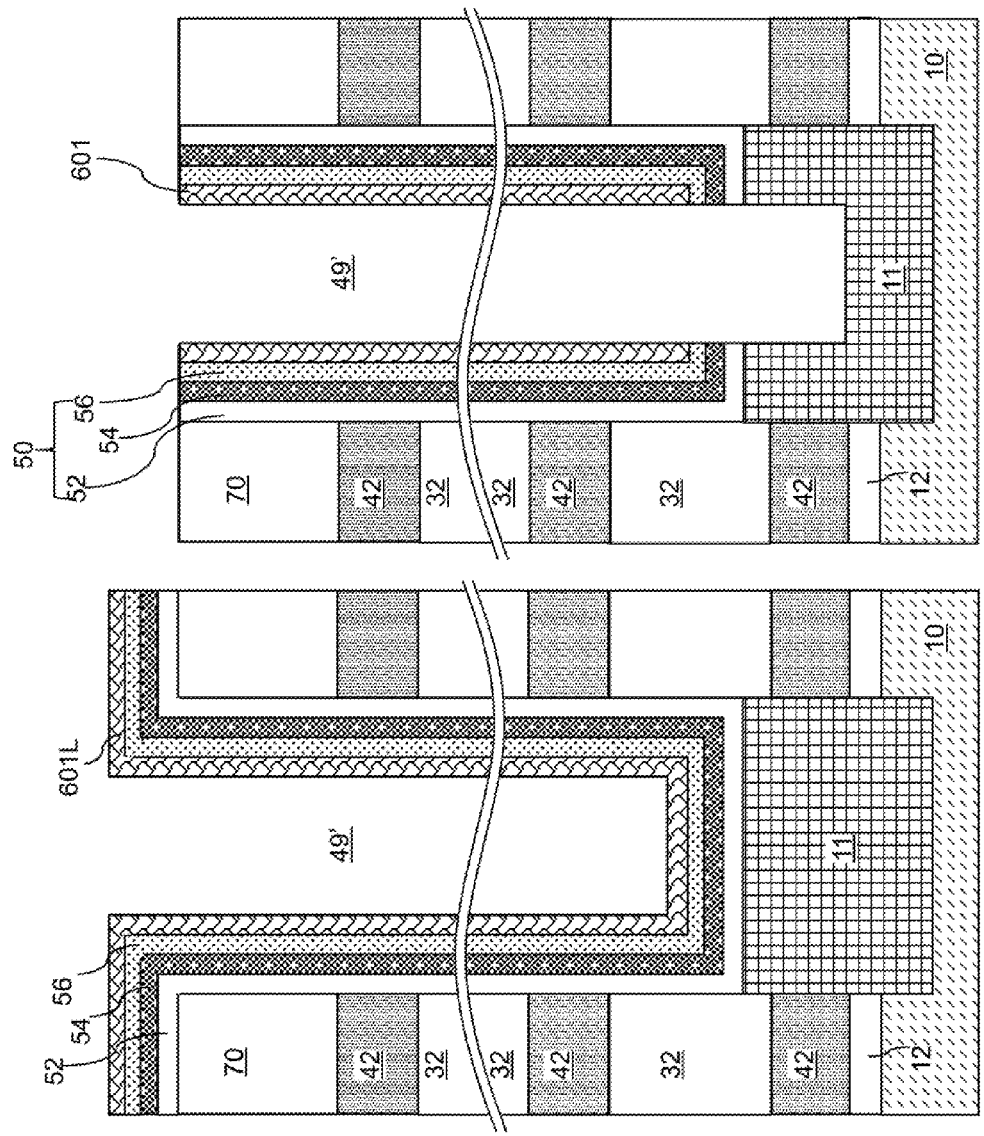

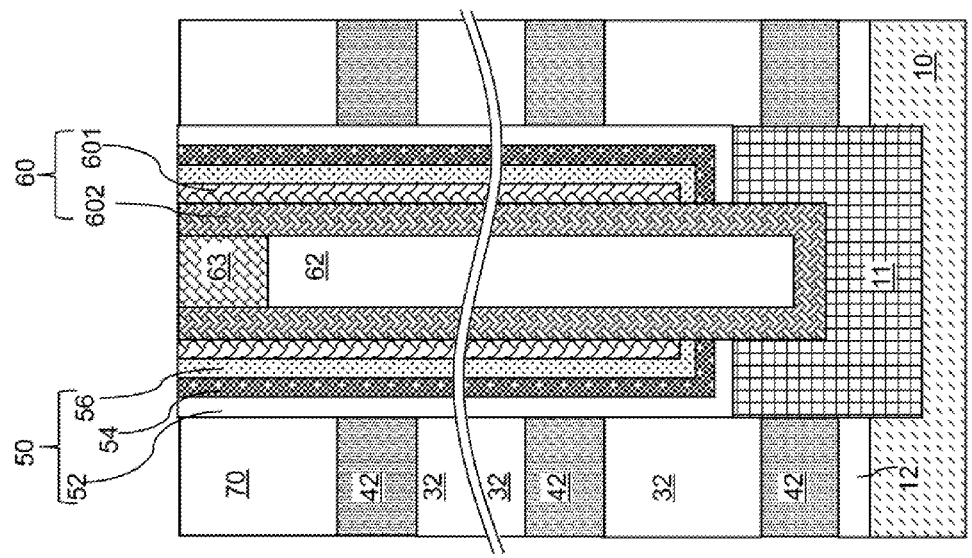
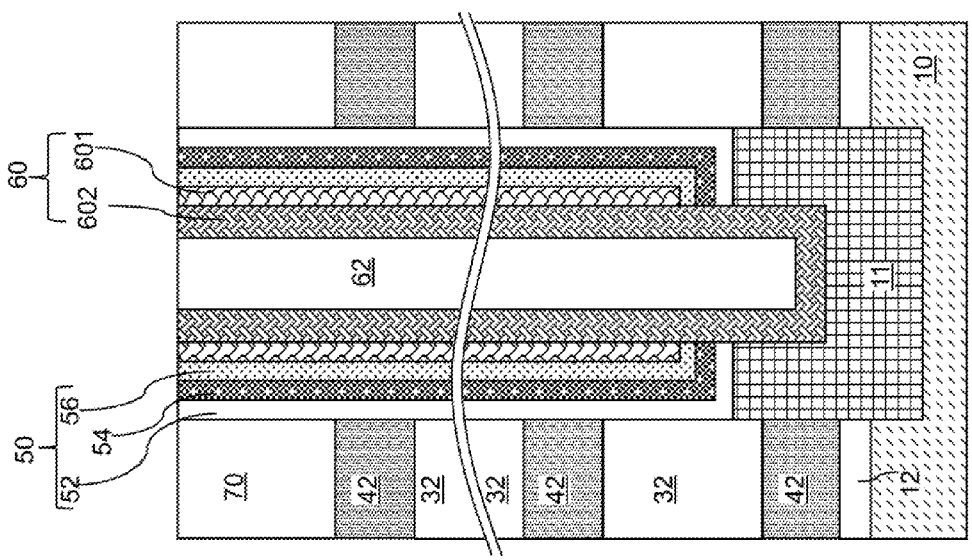
FIG. 8G
FIG. 8H

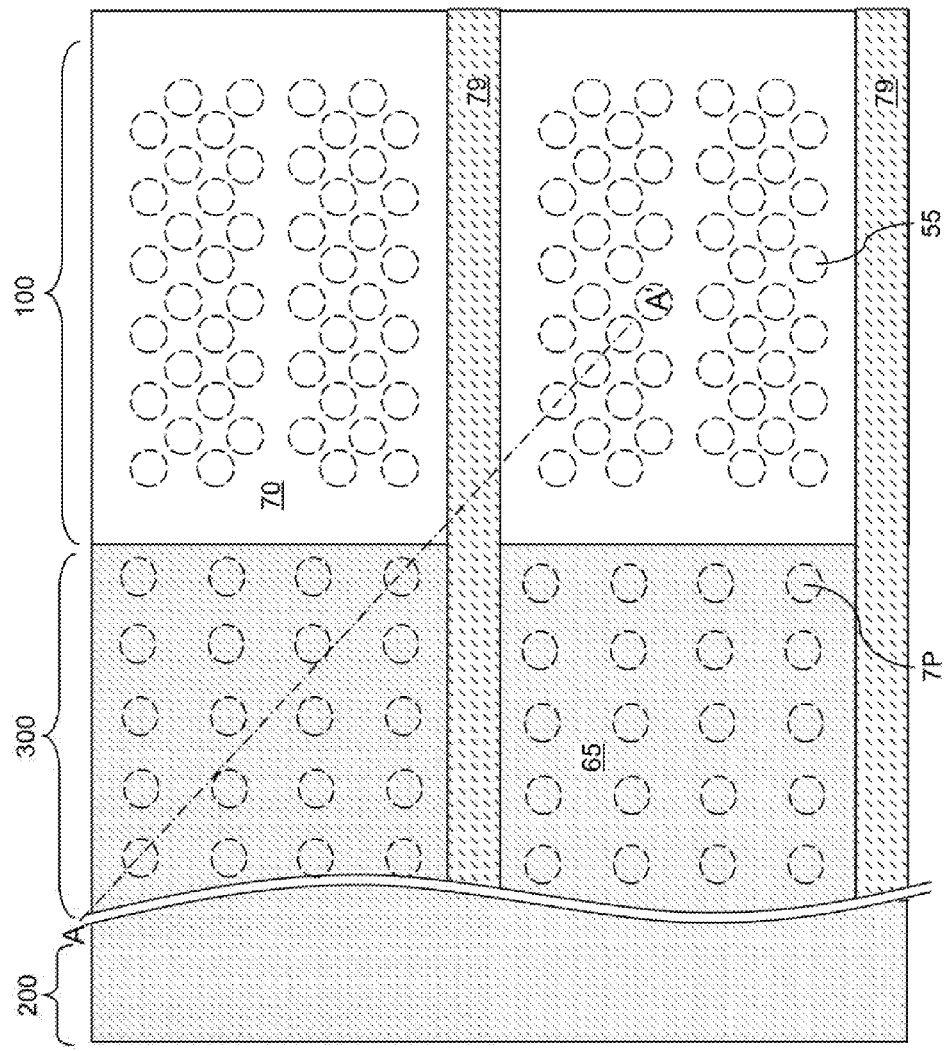

US 9,716,105 B1

THREE-DIMENSIONAL MEMORY DEVICE WITH DIFFERENT THICKNESS INSULATING LAYERS AND METHOD OF MAKING THEREOF

FIELD

The present disclosure relates generally to the field of semiconductor devices, and particular to a three-dimensional memory device employing an alternating stack of insulating layers and conductive materials having different layer thicknesses across regions and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which includes: an alternating stack of insulating layers and electrically conductive layers located over a substrate; memory stack structures extending through a first region of the alternating stack, wherein each of the memory stack structures comprises a memory film and a vertical semiconductor channel; and support pillar structures extending through a second region of the alternating stack that is laterally offset from the first region. Each insulating layer includes a respective first insulating material portion having a respective first insulator thickness in the first region of the alternating stack and a respective second insulating material portion having a respective second insulator thickness that is greater than the respective first insulator thickness in the second region.

According to another aspect of the present disclosure, a method of forming a three-dimensional memory device comprises forming an alternating stack of insulating layers and spacer material layers over a substrate, forming support openings through the alternating stack in a second region of the alternating stack, performing an anneal in an oxidizing ambient after forming the support openings, forming support pillar structures in the support openings after performing the anneal, forming memory openings through the alternating stack in a first region of the alternating stack after the steps of forming the support openings and forming the support pillar structures, forming memory stack structures in the memory openings, wherein each of the memory stack structures comprises a memory film and a vertical semiconductor channel, forming backside recesses by removing the spacer material layers selective to the insulating layers, and forming electrically conductive layers in the backside recesses.

BRIEF DESCRIPTION OF THE DRAWINGS

FIG. 3 is a schematic vertical cross-sectional view of the exemplary structure after formation of stepped terraces and a retro-stepped dielectric material portion according to an embodiment of the present disclosure.

FIG. 4B is a top-down view of the exemplary structure of FIG. 4A.

FIGS. 8A-8H are sequential schematic vertical cross-sectional views of a memory opening within the exemplary structure during various processing steps employed to form a memory stack structure according to an embodiment of the present disclosure.

FIG. 10B is a partial see-through top-down view of the exemplary structure of FIG. 10A. The vertical plane A-A' is the plane of the schematic vertical cross-sectional view of FIG. 10A.

DETAILED DESCRIPTION

Figure 1:
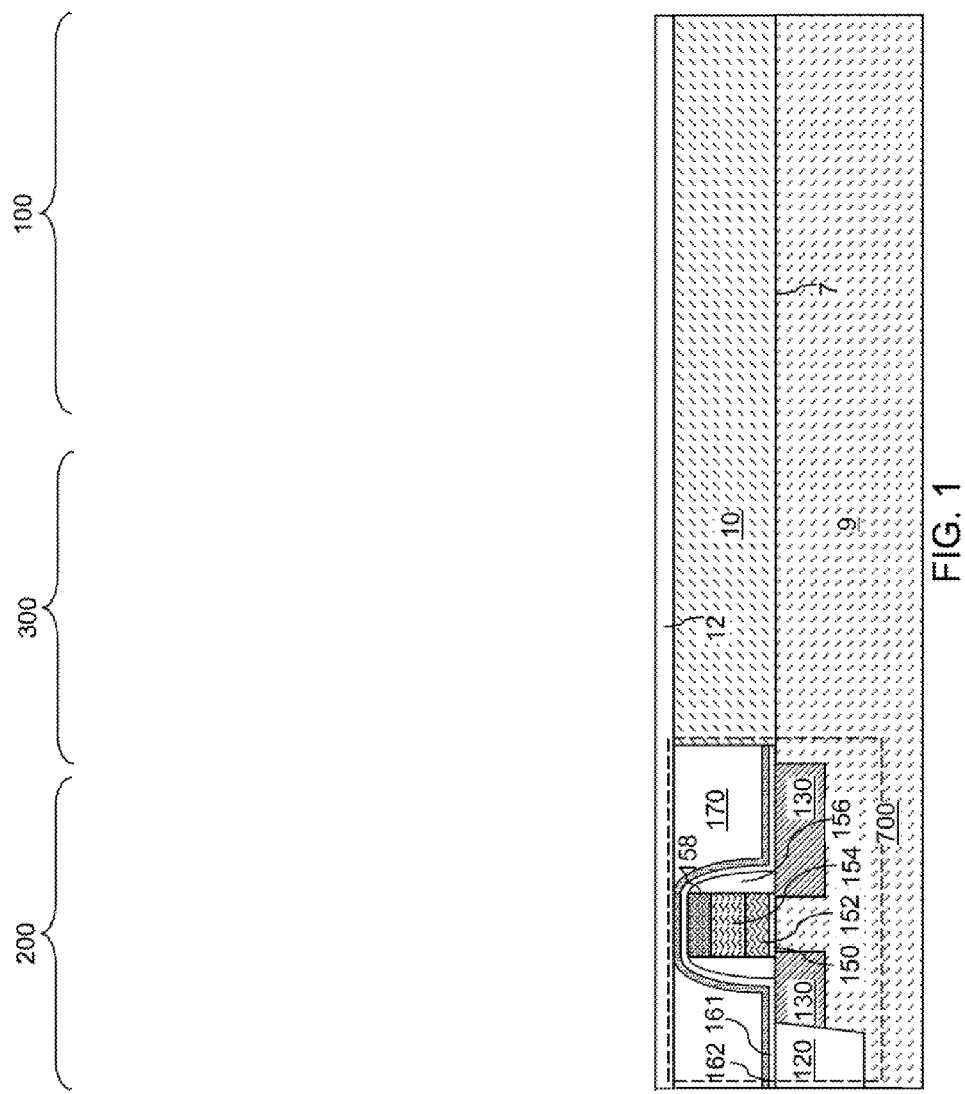
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Figure 2:
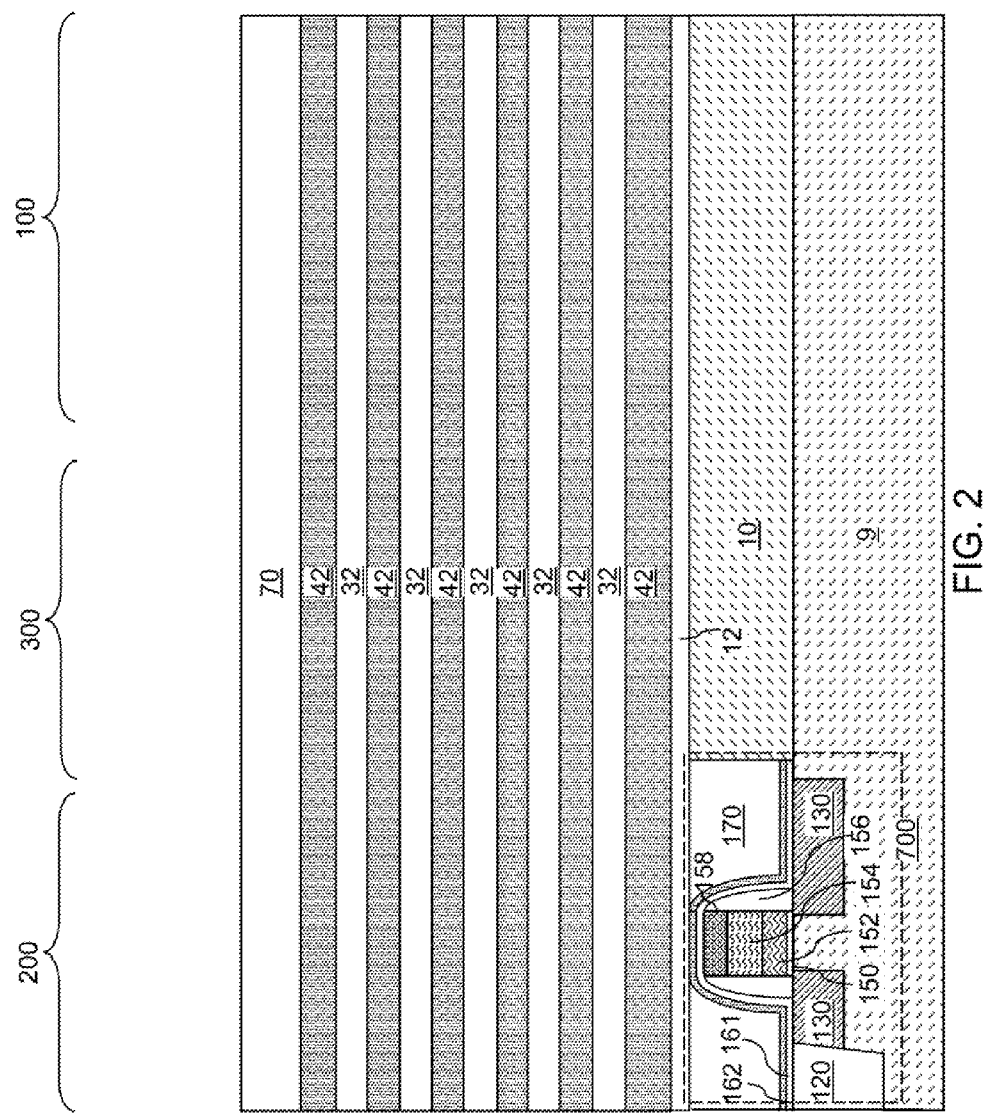
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material including oxygen. As such, each insulating layer 32 can be an insulating layer. Insulating materials that can be employed for the insulating layers 32 include, but are not limited to, silicon oxide (including doped or undoped silicon oxide), organosilicon oxide (OSG), spin-on dielectric materials, dielectric metal oxides that are commonly known as high dielectric constant (high-k) dielectric oxides (e.g., aluminum oxide, hafnium oxide, etc.), dielectric metal oxynitrides, and organic insulating materials. In one embodiment, the first material of the insulating layers 32 can be a silicon oxide. As used herein, a "silicon oxide" refers to any glass based on an oxide of silicon, and includes undoped silicon oxide, doped silicon oxides, and organosilicon oxides. In one embodiment, the insulating layers 32 can have an initial insulating material structure and/or composition throughout. In one embodiment, the initial insulating material composition of the insulating layers 32 can be a homogeneous composition.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 include a material that is impervious to oxygen, i.e., a material that is resistant to oxygen diffusion therethrough. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, a dielectric metal nitride, and a conductive metal nitride. In one embodiment, the sacrificial material layers 42 can be spacer material layers that comprise silicon nitride.

In one embodiment, the insulating layers 32 as formed with the initial insulating material composition comprise a silicon oxide, and the sacrificial material layers comprise silicon nitride. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Referring to FIG. 3, stepped terraces can be formed in the contact region 300. The portion of the contact region 300 that includes the stepped terraces is herein referred to as a terrace region. The stepped terraces can be formed by forming a stepped cavity within the contact region 300. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed applying and initially patterning a trimmable masking material layer, and by repetitively performing a set of processing steps. The set of processing steps can include, for example, an etch process of a first type (such as an anisotropic reactive ion etch) that vertically increases the depth of a cavity by one or more levels, and an etch process of a second type (referred to as a trimming process) that laterally expands the area to be vertically etched in a subsequent etch process of the first type. As used herein, a "level" of a structure including alternating plurality is defined as the relative position of a pair of a first material layer and a second material layer within the structure.

Within the terrace region formed on the alternating stack (32, 42), each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32*m* 42) that continuously extend from a bottommost layer within the alternating stack (32, 42) to a topmost layer within the alternating stack (32, 42).

A dielectric material such as silicon oxide is deposited over the stepped terraces in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity in the contact region 300 and the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the insulating cap layer 70.

Figure 4A:
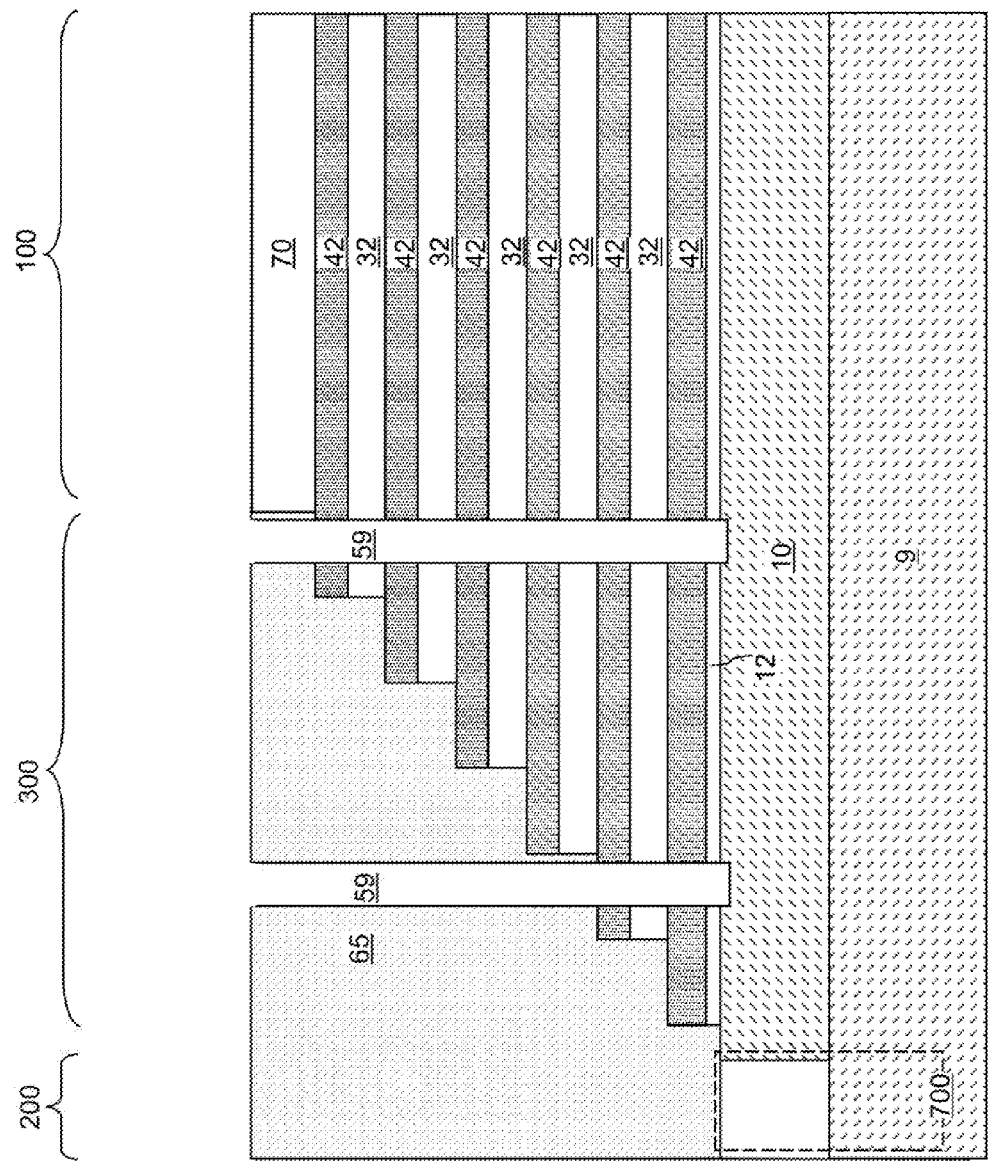
FIG. 4A is a schematic vertical cross-sectional view of the exemplary structure after formation of support openings in a contact region according to an embodiment of the present disclosure.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings in the lithographic material stack can be formed in the terrace region, i.e., within the contact region 300. The openings can be formed as discrete openings that are distributed in areas in which support pillar structures are to be subsequently formed.

The pattern in the lithographic material stack can be transferred through the retro-stepped dielectric material portion 65 and through the alternating stack (32, 42) by at least one anisotropic etch that employs the patterned lithographic material stack as an etch mask. Portions of the alternating stack (32, 42) underlying the openings in the patterned lithographic material stack are etched to form support openings 59 in the terrace region. In other words, the transfer of the pattern in the patterned lithographic material stack through the alternating stack (32, 42) forms the support openings 59 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the support openings 59 can be substantially vertical, or can be tapered. The patterned lithographic material stack can be subsequently removed, for example, by ashing.

In one embodiment, the support openings 59 are formed through the gate dielectric layer 12 so that the support openings 59 extend through the alternating stack (32, 42) to at least the top surface of the semiconductor material layer 10. In one embodiment, an overetch into the semiconductor material layer 10 may be optionally performed after the top surface of the semiconductor material layer 10 is physically exposed at a bottom of each support opening 59. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each support opening 59 can be coplanar with the topmost surface of the semiconductor material layer 10. Each of the support openings 59 can include a sidewall (or a plurality of sidewalls) that extends substantially perpendicular to the topmost surface of the substrate. The substrate semiconductor layer 9 and the semiconductor material layer 10 collectively constitutes a substrate (9, 10), which can be a semiconductor substrate. Alternatively, the semiconductor material layer 10 may be omitted, and the support openings 59 can be extend to a top surface of the substrate semiconductor layer 9. In one embodiment, openings may not be formed in the memory array region 100.

Figure 5:
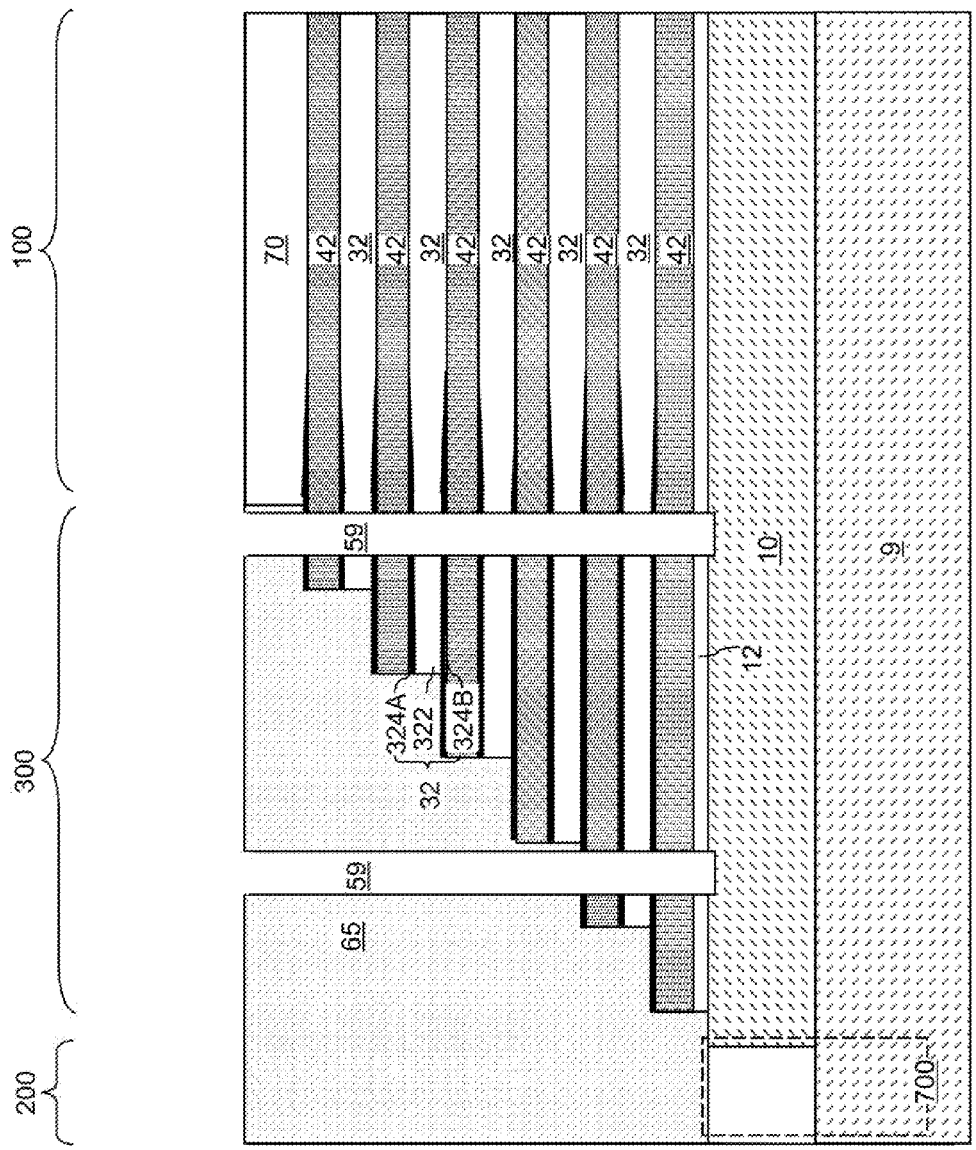
FIG. 5 is a schematic vertical cross-sectional view of the exemplary structure after locally modifying surface structure and/or composition of the insulating layers in the contact region of the alternating stack while not modifying the alternating stack in a first region according to an embodiment of the present disclosure.

Referring to FIG. 5, an anneal in an oxidizing ambient is performed at an elevated temperature. The anneal may include a suitable ambient, such as steam, oxygen, ozone, water vapor and combination thereof. Water vapor is preferred. The exemplary structure is located into an enclosure (which may be a vacuum-tight enclosure), and water vapor is provided into the enclosure while the enclosure is maintained at the elevated temperature. The water vapor can be generated in-situ or ex-situ by a water vapor generator (WVG). The temperature of the anneal can be in a range from 600 degrees Celsius to 1,000 degrees Celsius, although lesser and greater temperatures can also be employed. The partial pressure of the water vapor during the anneal process can be in a range from 1 mTorr to 1 atm, and/or may be in a range from 10 mTorr to 100 Torr, although lesser and greater partial pressures can also be employed.

The atoms provided in the water vapor diffuse into the support openings 59 and through the silicon oxide of the insulating layers 32, and interact with the silicon nitride material of the sacrificial material layers 42. Interaction of the water vapor with the silicon oxide material and the silicon nitride material at the interfaces between the insulating layers 32 and the sacrificial material layers 42 re-forms the interfaces between the silicon oxide and the silicon nitride. The insulating layers 32 are locally modified in the terrace region, which is located in the contact region 300, and is not modified in the memory array region 100. The structure, composition and/or thickness of the insulating layers 32 may be modified in the terrace region. Modified silicon oxide material portions (324A, 324B) are formed at the interface between the insulating layers 32 and the sacrificial material layer 42 within an area in the contact region 300 of the alternating stack (32, 42) by conversion of surface portions of the insulating layers 32. Each insulating layer 32 in the alternating stack (32, 42) includes modified silicon oxide material portions (324A, 324B), which are surface portions having a modified structure (e.g., density) and/or composition that is different from that of the initial insulating material composition at interfaces with the spacer material layers (i.e., the sacrificial material layers 42).

The lateral extent of the area in which the modified silicon oxide material portions (324A, 324B) are formed is determined by the lateral extent of diffusion of the oxygen containing molecules or atoms of the water vapor. Without wishing to be bound by any particular theory, it is believed that oxygen atoms, hydrogen atoms, and/or water molecules from the water vapor interact with the oxygen atoms, nitrogen atoms, and silicon atoms at the interfaces between the insulating layers and the sacrificial material layers to modify the structure and/or composition of the surface portions of the insulating layers 32 to form the modified silicon oxide material portions (324A, 324B). Without wishing to be bound by any theory, the modified silicon oxide material portions (324A, 324B) may have a higher density or a different composition (e.g., nitrogen doped silicon oxide) than the initial silicon oxide material portions 322 which may have a lower density and/or not contain nitrogen. In an alternative embodiment, and without wishing to be bound by a particular theory, the water vapor may modify the composition and/or structure (e.g., density) not only at the surface area but also the entire area (i.e., entire thickness) of the silicon oxide insulating layers 32 in the contact (i.e., staircase) region 300. Thus, the entire the silicon oxide insulating layers 32 in region 300 can be converted to modulated silicon oxide material portions and the initial silicon oxide material portions 322 are replaced with the modulated silicon oxide material portions in this alternative embodiment.

The thickness of the modulated silicon oxide material portions (324A, 324B) gradually decreases along the direction toward the memory array region 100. In other words, the modulated silicon oxide material portions (324A, 324B) includes a taper region in which the thickness of the modulated silicon oxide material portions (324A, 324B) gradually decreases to zero. Formation of the taper region in the modulated silicon oxide material portions (324A, 324B) is due to the finite diffusion of the molecules or atoms in the water vapor through the insulating layers 32. Within the taper region, the thickness of the modulated silicon oxide material portions (324A, 324B) can be self-limiting due to the interfacial nature of the modulated silicon oxide material portions (324A, 324B), thereby forming region having a substantially uniform thickness. The thickness of each modulated silicon oxide material portion (324A, 324B) can be in a range from 1 nm to 6 nm, although lesser and greater thicknesses can also be employed depending on the process parameters of the anneal process.

Each modified silicon oxide material portion (324A, 324B) can extend to the retro-stepped dielectric material portion 65. In case the retro-stepped dielectric material portion 65 comprises a silicon oxide (such as undoped silicon oxide or a doped silicon oxide), the modulated silicon oxide material portions (324A, 324B) can include segments formed by conversion of surface portions of the retro-stepped dielectric material portion 65 contacting the alternating stack (32, 42). The dielectric material of the insulating layers 32 as initially deposited can include a first silicon oxide material, and portions of the insulating layers 32 that are not modified with respect to the initial structure and/or composition are herein referred to as first silicon oxide material portions 322. The modified silicon oxide material portions (324A, 324B) includes a second silicon oxide material that can be different from the first silicon oxide material in structure and/or composition, and is herein referred to as second silicon oxide material portions 324. In another alternative embodiment, and without wishing to be bound by a particular theory, the anneal in the oxidizing ambient, such as water vapor thickens the silicon oxide layers 32 and thins the sacrificial silicon nitride layers 42 by converting interface portion of the silicon nitride layers 42 adjacent to layers 32 to silicon oxide portions 324. The silicon oxide portions may comprise doped silicon oxide, such as nitrogen doped silicon oxide (e.g., silicon oxynitride) or undoped silicon oxide. The addition of silicon oxide portions 324 to preexisting silicon oxide portions 322 causes the silicon oxide layers 32 to become thicker and the sacrificial material layers 42 to become thinner in region 300 but not in region 100.

Each insulating layer 32 includes a first silicon oxide material portion 322, an upper second silicon oxide material portion 324A overlying the first silicon oxide material portion 322, and a lower second silicon oxide material portion 324B underlying the first silicon oxide material portion 322 in the contact region after locally modifying the surface structure and/or composition of the insulating layers 32. In one embodiment, the first silicon oxide material portion includes a first silicon oxide material, and the upper second silicon oxide material portion 324A and the lower second silicon oxide material portion 324B can include a second silicon oxide material that can different from the first silicon oxide material 322.

Without wishing to be bound by a particular theory, it is believed that the second silicon oxide material can have a lower etch rate than the first silicon oxide material in a hot phosphoric acid solution including phosphoric acid at a concentration in a range from 80% to 94% than the first silicon oxide material. The boiling point of phosphoric acid varies with the concentration of the acid. For example, the boiling point of phosphoric acid solutions for a range of acid concentration from 79.5% to 94.5% can be from 140° C. to 200° C. The etch rate of silicon nitride varies with the temperature and the concentration of the acid. Due to constant evaporation of water, control mechanisms to continuously add water and to maintain the temperature can be employed during a wet etch process employing a hot phosphoric acid solution. Hot phosphoric acid can etch silicon nitride selective to thermal silicon oxide with selectivity greater than 20, and can etch silicon nitride selective to less dense silicon oxides with a higher selectivity than the selectivity with respect to thermal silicon oxide. Thus, the selectivity of the etch process employing a hot phosphoric acid solution for etching silicon nitride with respective to the second silicon oxide material of the modulated silicon oxide material portions (324A, 324B) is greater than the selectivity of the etch process for etching silicon nitride with respect to the first silicon oxide material. In other words, less second silicon oxide material from portions 324 is removed in region 300 than first silicon oxide material from portions 322 is removed in region 100 during the hot phosphoric acid etching of the sacrificial material layers 42. In one embodiment, a hot phosphoric acid solution including phosphoric acid at a concentration of about 79.5% and having a boiling point of about 140° C. can be employed to provide high etch selectivity of silicon nitride with respect to various silicon oxides. Alternatively, without wishing to be bound by a particular theory, if the second silicon oxide portions 324 are formed by converting an interfacial part of the silicon nitride layers 42 to doped or undoped silicon oxide in region 300 but not in region 100, then the silicon oxide layers 32 are thicker in region 300 than in region 100, and the silicon nitride sacrificial material layers 42 are thinner in region 300 than in region 100.

Figure 6:
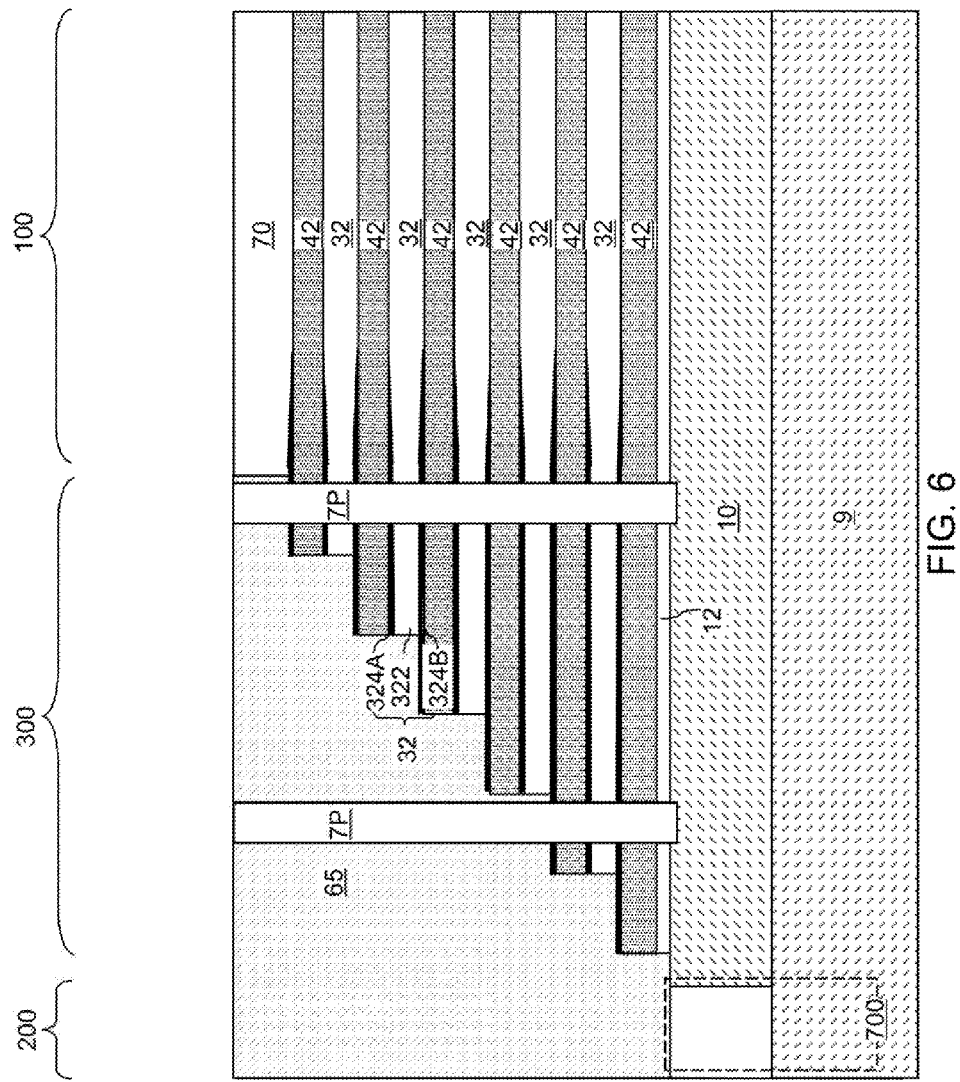
FIG. 6 is a schematic vertical cross-sectional view of the exemplary structure after formation of support pillar structures according to an embodiment of the present disclosure.

Referring to FIG. 6, the support openings are filled with at least one dielectric material to form support pillar structures 7P. The at least one dielectric material can include silicon oxide, silicon oxynitride, a dielectric metal oxide, and/or a dielectric metal oxynitride. The at least one dielectric material can be deposited by a conformal deposition process such as chemical vapor deposition (CVD). Excess portions of the deposited dielectric material may, or may not, be removed from above the top surface of the insulating cap layer 70. If the at least one dielectric material is removed from above the top surface of the insulating layer 70, the top surface of the insulating layer 70 may be employed as a stopping surface.

Figure 7:
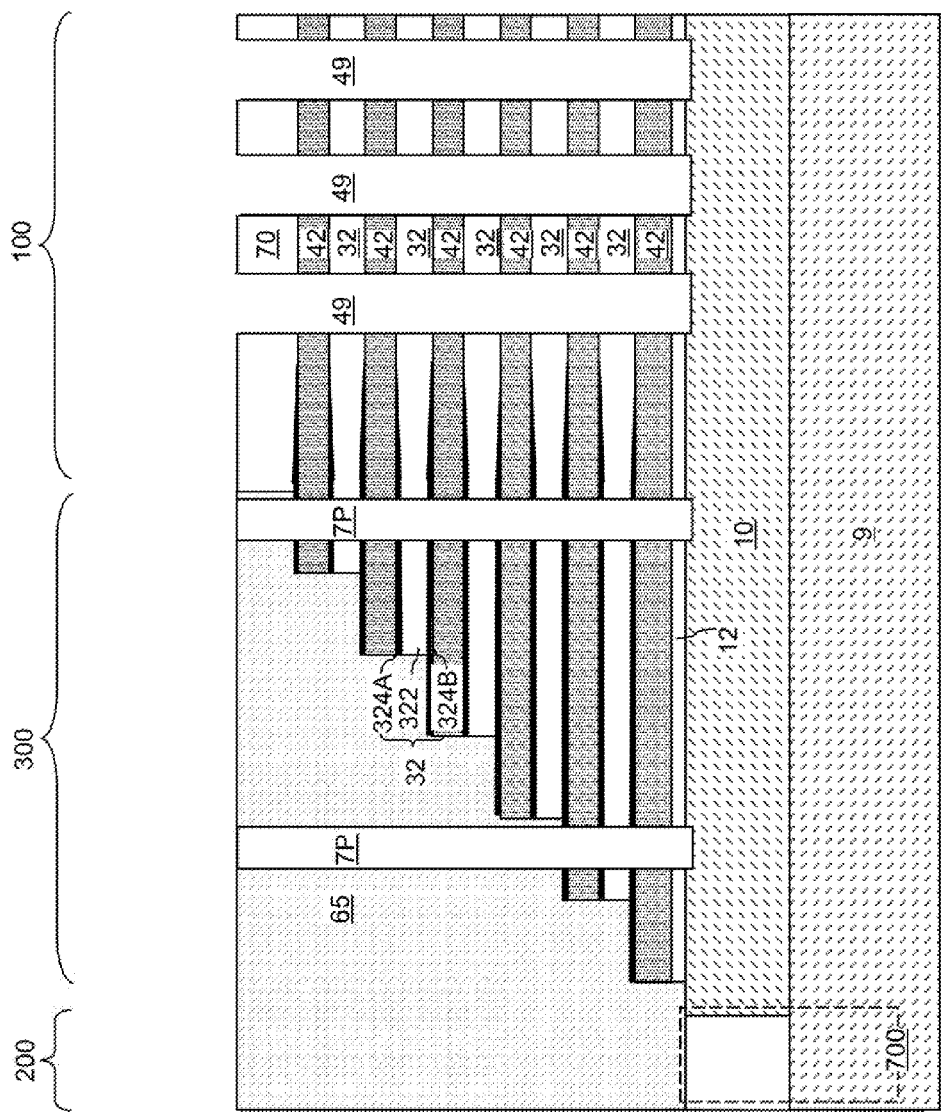
FIG. 7 is a schematic vertical cross-sectional view of the exemplary structure after formation of memory openings according to an embodiment of the present disclosure.

Referring to FIG. 7, a lithographic material stack (not shown) including at least a photoresist layer can be formed over the insulating cap layer 70 and the retro-stepped dielectric material portion 65, and can be lithographically patterned to form openings in the memory array region 100. The pattern in the lithographic material stack can be transferred through the insulating cap layer 70 and through the entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The memory openings 49 are formed after (i.e., in a separate photolithography and etching step) than the support openings 59 and after the anneal in oxidizing ambient. The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 are formed through the gate dielectric layer 12 so that the memory openings 49 extend from the top surface of the alternating stack (32, 42) to at least the top surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The array of memory openings 49 is formed in the memory array region 100. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the substrate semiconductor layer 9.

Referring to FIG. 8A, a memory opening 49 in the exemplary device structure of FIG. 7 is illustrated. The memory opening 49 extends through the insulating cap layer 70, the alternating stack (32, 42), the gate dielectric layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 8B, an optional epitaxial channel portion (e.g., an epitaxial pedestal) 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Referring to FIG. 8C, a stack of layers including a blocking dielectric layer 52, a charge storage layer 54, a tunneling dielectric layer 56, and an optional first semiconductor channel layer 601L can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (52, 54, 56, 601L).

Referring to FIG. 8D, the optional first semiconductor channel layer 601L, the tunneling dielectric layer 56L, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601L, the tunneling dielectric layer 56, the charge storage layer 54, and the blocking dielectric layer 52 at a bottom of each cavity 49' can be removed to form openings in remaining portions thereof. Each of the first semiconductor channel layer 601L, the tunneling dielectric layer 56, the charge storage layer 54, and the blocking dielectric layer 52 can be etched by anisotropic etch process.

Each remaining portion of the first semiconductor channel layer 601L constitutes a first semiconductor channel portion 601. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the epitaxial channel portion 11 (or a surface of the semiconductor substrate layer 10 in case the epitaxial channel portions 11 are not employed) can be physically exposed underneath the opening through the first semiconductor channel portion 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel portion 601, the tunneling dielectric layer 56, the charge storage layer 54, and the blocking dielectric layer 52 can have vertically coincident sidewalls.

Figure 8F:
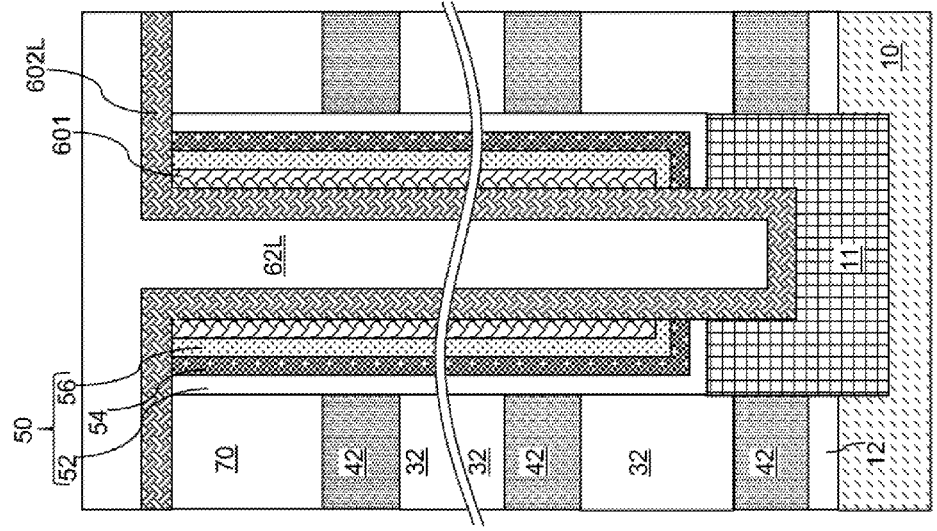
Figure 8E:
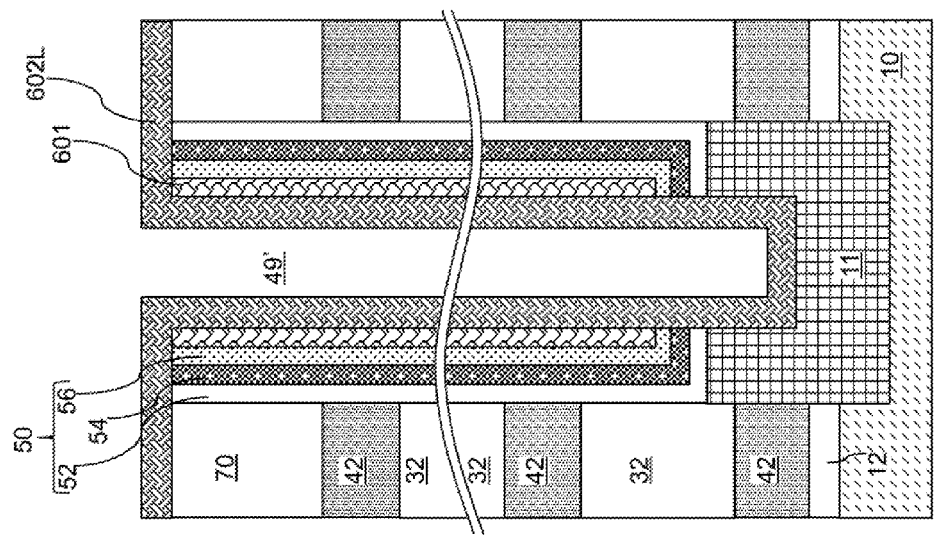

Referring to FIG. 8E, a second semiconductor channel layer 602L can be deposited directly on the semiconductor surface of the epitaxial channel portion 11 or the semiconductor substrate layer 10 if portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material.

In other words, the semiconductor channel material is a set of all semiconductor material in the first semiconductor channel portion 601 and the second semiconductor channel layer 602L.

Referring to FIG. 8F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicon oxide. The dielectric core layer 62L can be deposited by a conformal deposition method such as low pressure chemical vapor deposition (LPCVD), or by a self-planarizing deposition process such as spin coating.

Referring to FIG. 8G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric layer 56 is surrounded by a charge storage layer 54, and laterally surrounds a portion of the semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 8H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 9:
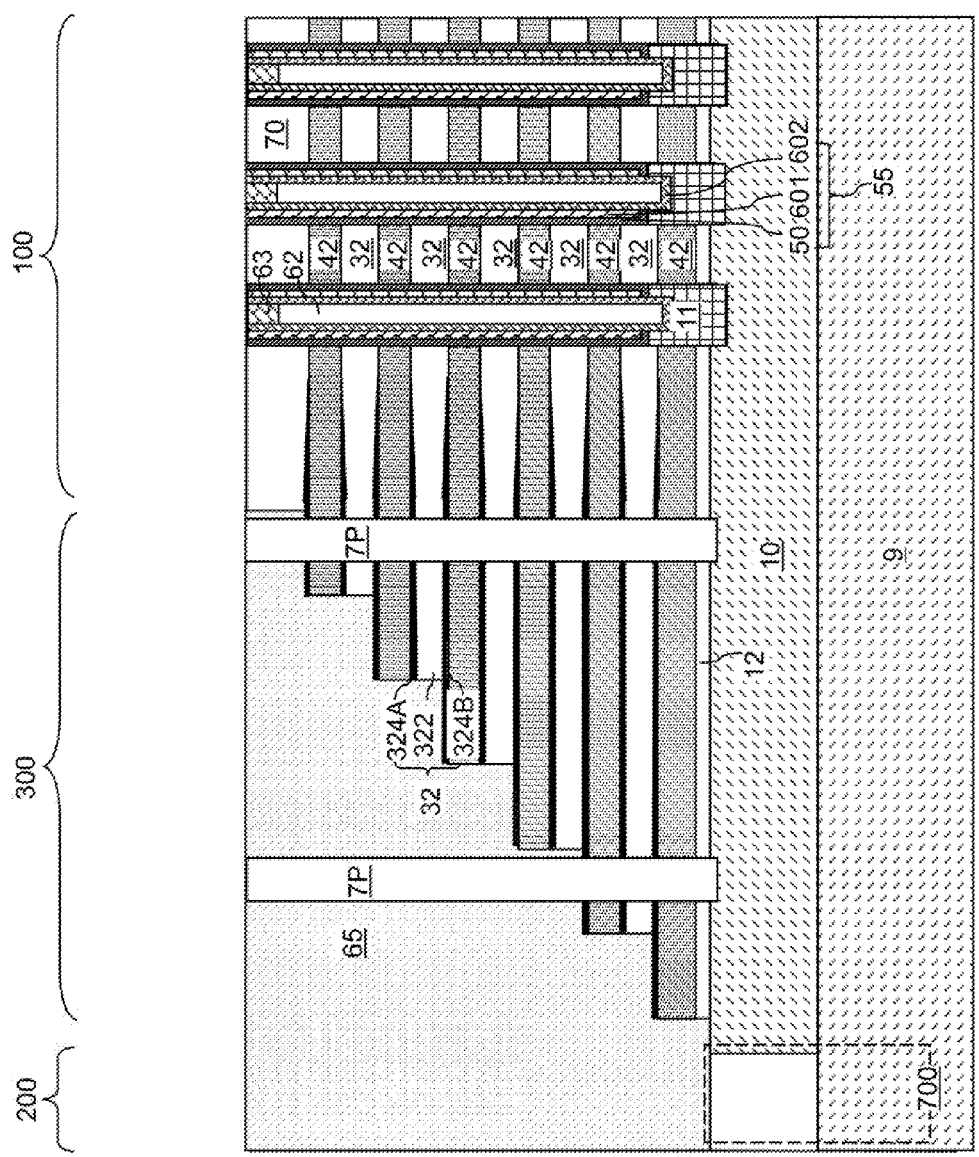
FIG. 9 is a schematic vertical cross-sectional view of the exemplary structure after formation of memory stack structures according to an embodiment of the present disclosure.

The exemplary memory stack structure 55 can be embedded into the exemplary structure illustrated in FIG. 7. FIG. 9 illustrates the exemplary structure that incorporates multiple instances of the exemplary memory stack structure of FIG. 8H. Each exemplary memory stack structure 55 includes a semiconductor channel 60 which may comprise layers (601, 602) and a memory film 50. The memory film 50 may comprise a tunneling dielectric layer 56 laterally surrounding the semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including a polycrystalline semiconductor channel.

Figure 10A:
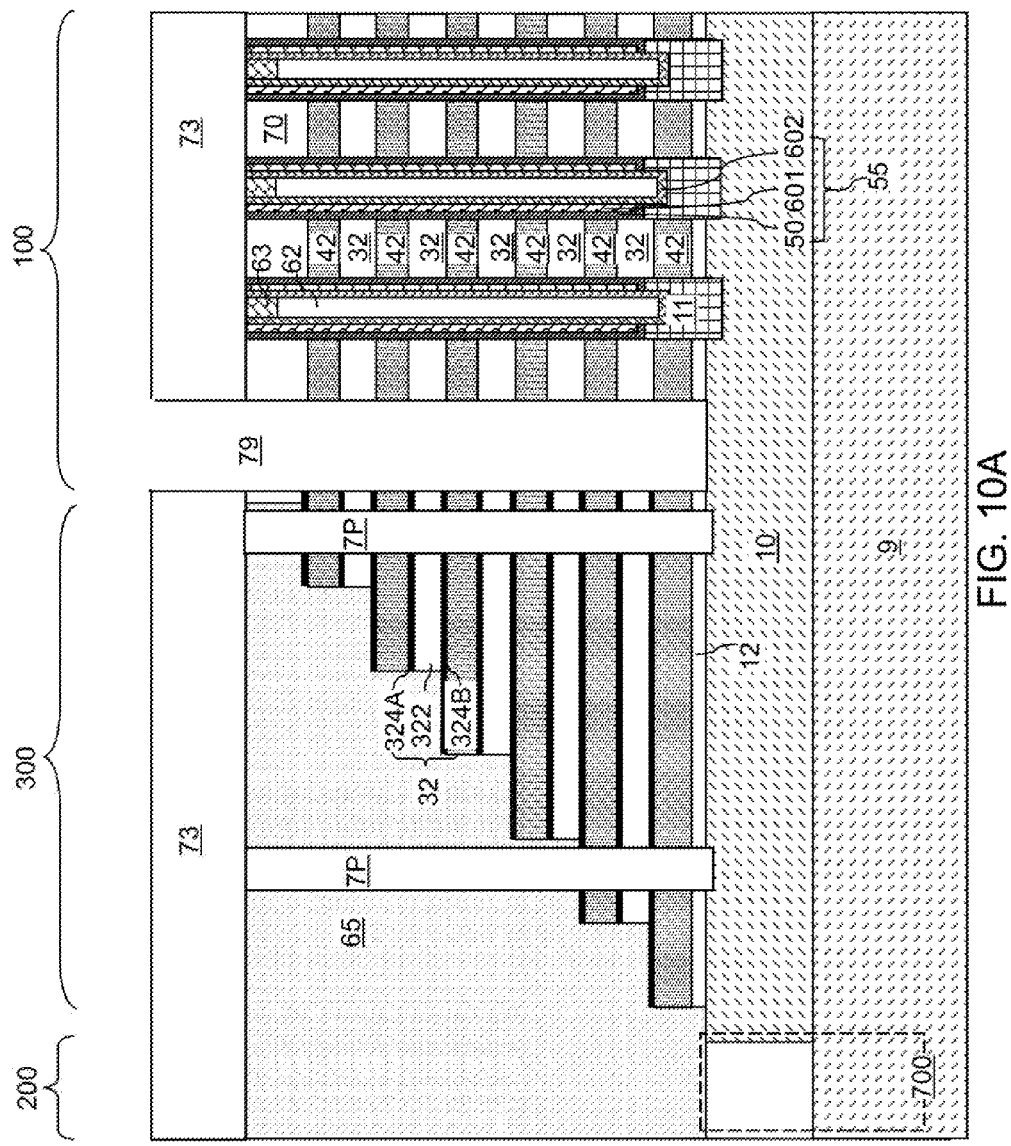
FIG. 10A is a schematic vertical cross-sectional view of the exemplary structure after formation of a backside trench according to an embodiment of the present disclosure.

Referring to FIGS. 10A and 10B, at least one dielectric support pillar 7P may be optionally formed through the retro-stepped dielectric material portion 65 and/or through the insulating cap layer 70 and/or through the alternating stack (32, 42). The plane. A-A' in FIG. 10B corresponds to the plane of the schematic vertical cross-sectional view of FIG. 10A. In one embodiment, the at least one dielectric support pillar 7P can be formed in the contact region 300, which is located adjacent to the memory array region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the insulating cap layer 70 concurrently with deposition of the at least one dielectric support pillar 7P can be present over the insulating cap layer 70 as a contact level dielectric layer 73. Each of the at least one dielectric support pillar 7P and the contact level dielectric layer 73 is an optional structure. As such, the contact level dielectric layer 73 may, or may not, be present over the insulating cap layer 70 and the retro-stepped dielectric material portion 65. Alternatively, formation of the contact level dielectric layer 73 may be omitted, and at least one via level dielectric layer may be subsequently formed, i.e., after formation of a backside contact via structure The contact level dielectric layer 73 and the at least one dielectric support pillar 7P can be formed as a single continuous structure of integral construction, i.e., without any material interface therebetween. In another embodiment, the portion of the dielectric material that is deposited over the insulating cap layer 70 concurrently with deposition of the at least one dielectric support pillar 7P can be removed, for example, by chemical mechanical planarization or a recess etch. In this case, the contact level dielectric layer 73 is not present, and the top surface of the insulating cap layer 70 can be physically exposed.

A photoresist layer (not shown) can be applied over the alternating stack (32, 42), and is lithographically patterned to form at least one elongated opening in each area in which formation of a backside contact via structure is desired. The pattern in the photoresist layer can be transferred through the alternating stack (32, 42) and/or the retro-stepped dielectric material portion 65 employing an anisotropic etch to form the at least one backside trench 79, which extends at least to the top surface of the substrate (9, 10). In one embodiment, the at least one backside trench 79 can include a source contact opening in which a source contact via structure can be subsequently formed.

Figure 11:
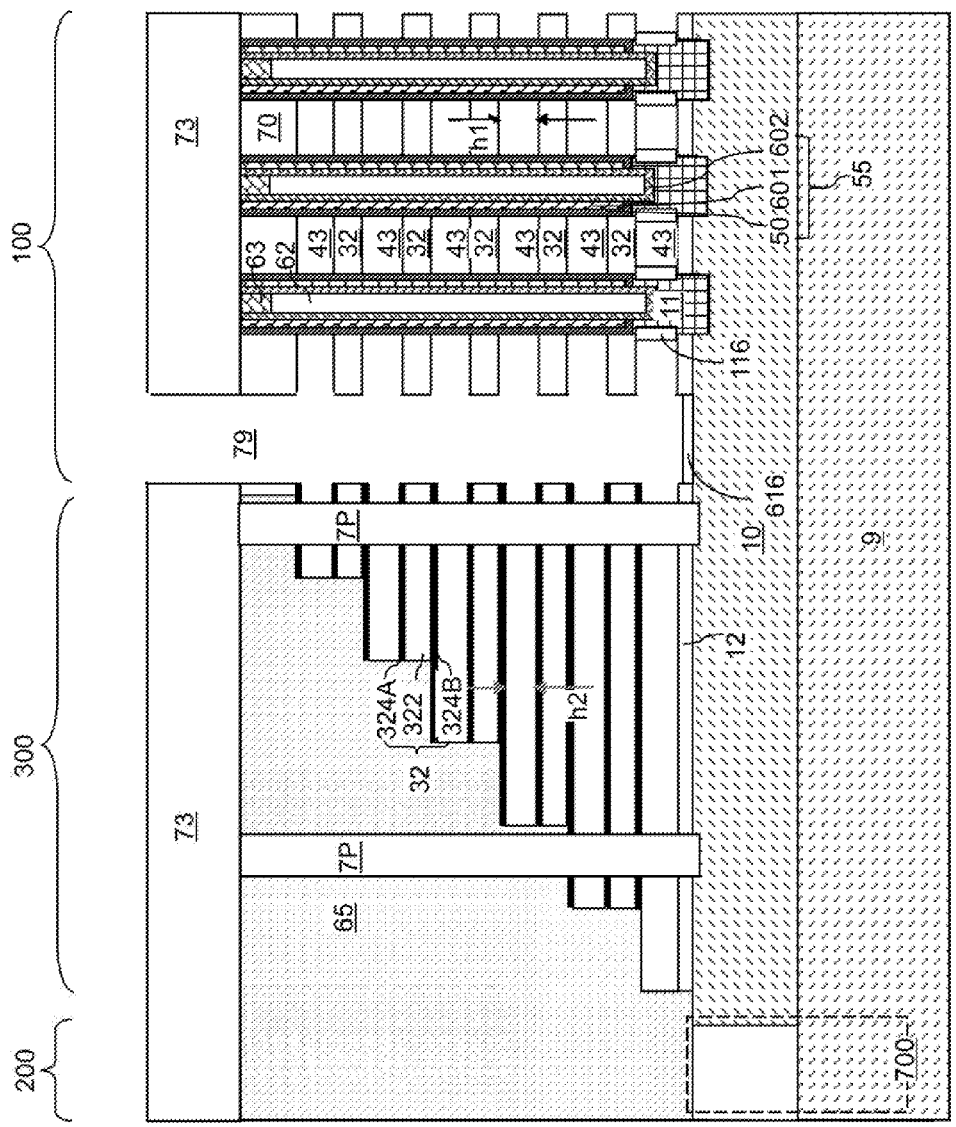
FIG. 11 is a schematic vertical cross-sectional view of the exemplary structure after formation of backside recesses according to an embodiment of the present disclosure.

Referring to FIG. 11, an etchant that selectively etches the second material of the sacrificial material layers 42 with respect to the materials of the insulating layers 32 can be introduced into the at least one backside trench 79, for example, employing an etch process. Backside recesses 43 are formed in volumes from which the sacrificial material layers 42 are removed. The removal of the second material of the sacrificial material layers 42 can be selective to the materials of the insulating layers 32, the material of the at least one dielectric support pillar 7P, the material of the retro-stepped dielectric material portion 65, the semiconductor material of the semiconductor material layer 10, and the material of the outermost layer of the memory films 50. Since the selectivity of the etchant that etches the material of the sacrificial material layers 42 with respect to the first silicon oxide material of the first silicon oxide material portions 322 and the second silicon oxide material of the second silicon oxide material portions (324A, 324B) is finite, collateral etching of the surface portions of the first silicon oxide material portions 322 and the second silicon oxide material portions (324A, 324B) can occur during removal of the sacrificial material layers 42.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Without wishing to be bound by a particular theory, it is believed that the selectivity of the etch process that etches the material of the sacrificial material layers 42 with respect to the second silicon oxide material of the second silicon oxide material portions (324A, 324B) can be greater than the selectivity of the etch process that etches the material of the sacrificial material layers 42 with respect to the first silicon oxide material of the first silicon oxide material portions 322 by a factor greater than 2, such as a factor greater than 3, and preferably a factor greater than 5 (such as 10). For example, the sacrificial material layers 42 can include silicon nitride, the first silicon oxide material portions 322 can include a first silicon oxide material with respect to which a wet etch process for etching silicon nitride employing hot phosphoric acid provides a first selectivity (which may be in a range from 10 to 30), and the second silicon oxide material portions 324 (i.e., (324A, 324B)) can include a second silicon oxide material with respect to which the wet etch process for etching silicon nitride employing the hot phosphoric acid provides a second selectivity (which may be in a range from 20 to 80) that is greater than the first selectivity. Thus, when the second silicon oxide material portions 324 are present, a smaller amount of silicon oxide insulating layers 32 are removed during the etching of the sacrificial material layers 42 than if the second silicon oxide material portions 324 were absent. Alternatively, without wishing to be bound by a particular theory, if the interfacial portions of the sacrificial material layers 42 are converted to the second silicon oxide material portions 324, then layers 42 are thinner in region 300 than in region 100, and layers 32 are thicker in region 300 than in region 100. This can result in a greater height of the backside recesses 43 in region 100 than in region 300.

Generally speaking, backside recesses 43 can be formed by removing the spacer material layers (i.e., the sacrificial material layers 42) selective to the insulating layers 32 employing an etchant that provides a greater etch selectivity with respect to the modified structure and/or composition of the second silicon oxide material portions (324A, 324B) than with respect to the initial insulating material structure and/or composition, which is the structure and/or composition of the first silicon oxide material portions 322. Thus, each physically exposed surface of the second silicon oxide material portions (324A, 324B) can be recessed by a smaller distance than physically exposed surfaces of the first silicon oxide material portions 322.

Each backside recess 43 can laterally extend from a first region (such as the memory array region 100) in which each insulating layer 32 consist of a region of a respective first silicon oxide material portion 322 to a second region (such as the contact region 300) in which each insulating layer 32 includes a region of respective first silicon oxide material portion 322 and regions of an upper second silicon oxide material portion 324A and a lower second silicon oxide material portion 324B. Each backside recess 43 can have a greater height in the first region (such as the memory array region 100) in which physically exposed surfaces of the first silicon oxide material portions 322 are present than in the second region (such as the contact region 300) in which physically exposed surfaces of the second silicon oxide material portions (324A, 324B) are present. For example, each of a plurality of lateral recesses 43 can have a first height h1 in the memory array region 100 and a second height h2 in the contact region 300. The first height h1 can be greater than the second height h2 by a thickness differential in a range from 1 nm to 10 nm, although lesser and greater thickness differentials can also be employed.

In one embodiment, the sacrificial material layers 42 can include silicon nitride, and the materials of the at least one dielectric support pillar 7P and the retro-stepped dielectric material portion 65 can be selected from silicon oxide and dielectric metal oxides.

Subsequently, physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 12:
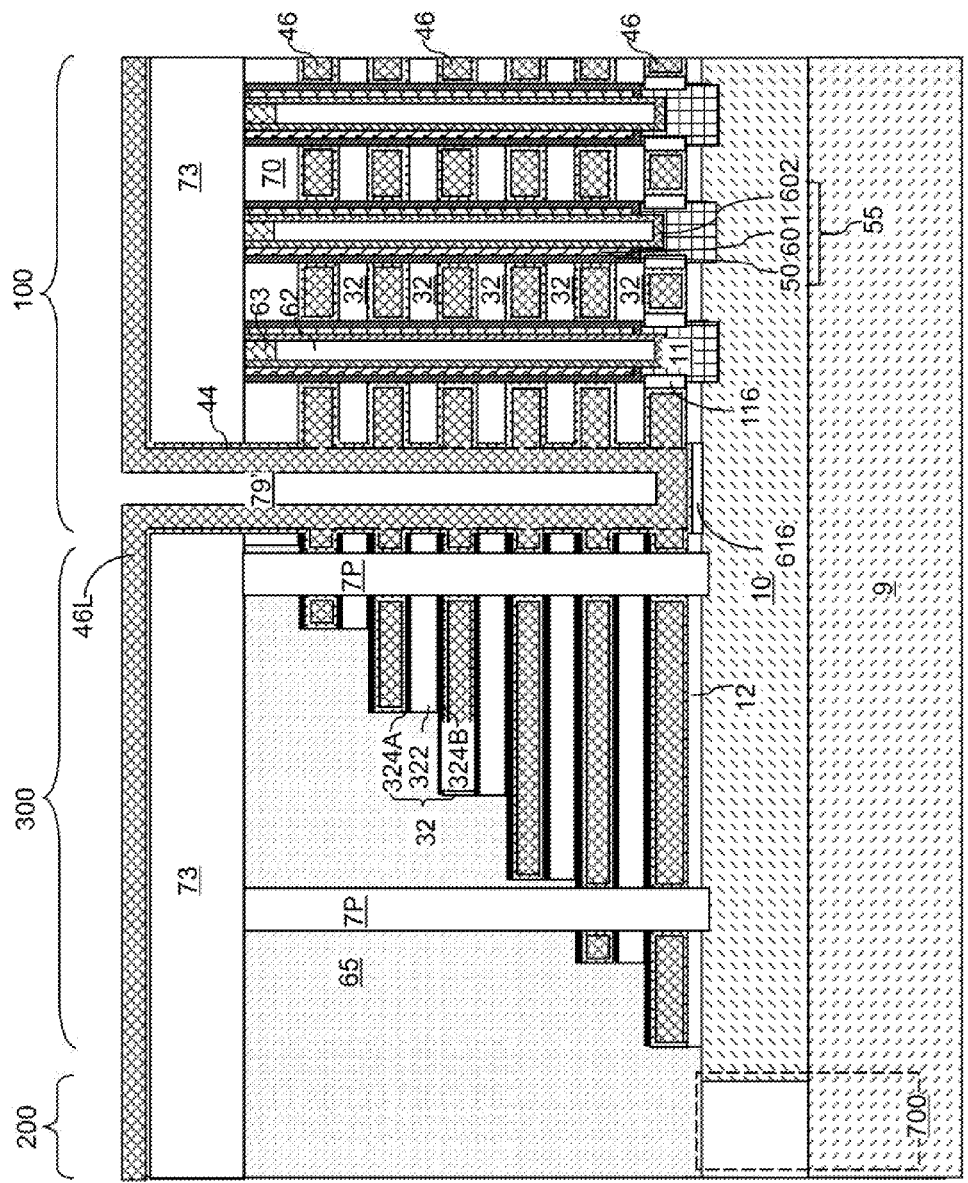
FIG. 12 is a schematic vertical cross-sectional view of the exemplary structure after formation of electrically conductive layers according to an embodiment of the present disclosure.

Referring to FIG. 12, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present The backside blocking dielectric layer 44 can be formed in the backside recesses 43 and on a sidewall of the backside trench 79. The backside blocking dielectric layer 43 can be formed directly on horizontal surfaces of the insulating layers 32 and physically exposed sidewalls of the backside dielectric 52 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the at least one backside trench 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer.

At least one conducive material can be deposited to form electrically conductive layers 46. The at least one conductive material can include a metallic liner and a conductive fill material layer. The metallic liner can include a metallic nitride material such as TiN, TaN, WN, an alloy thereof, or a stack thereof. The metallic liner functions as a diffusion barrier layer and an adhesion promotion layer. The metallic liner can be deposited by a conformal deposition method such as chemical vapor deposition (CVD) or atomic layer deposition (ALD), and can have a thickness in a range from 1 nm to 6 nm, although lesser and greater thicknesses can also be employed. The conductive fill material layer can be deposited directly on the metallic liner by a conformal deposition method such as chemical vapor deposition or atomic layer deposition. The conductive fill material layer includes a conductive material. The conductive material can include at least one elemental metal such as W, Cu, Co, Mo, Ru, Au, and Ag. Additionally or alternatively, the conductive fill material layer 464 can include at least one intermetallic metal alloy material. Each intermetallic metal alloy material can include at least two metal elements selected from W, Cu, Co, Mo, Ru, Au, Ag, Pt, Ni, Ti, and Ta. In one embodiment, the conductive fill material layer can consist essentially of W, Co, Mo, or Ru.

Each portion of the at least one conducive material that fills a backside recess 43 constitutes an electrically conductive layer 46. The portion of the at least one conductive material that excludes the electrically conductive layers 46 constitutes continuous metallic material layer 46L. A plurality of electrically conductive layers 46 can be formed in the plurality of backside recesses 43, and the continuous metallic material layer 46L can be formed on the sidewalls of each backside trench 79 and over the contact level dielectric layer 73. Thus, each sacrificial material layer 42 can be replaced with an electrically conductive layer 46. A backside cavity 79' is present in the portion of each backside trench 79 that is not filled with the backside blocking dielectric layer and the continuous metallic material layer 46L. A tubular dielectric spacer 116 laterally surrounds a respective epitaxial channel portion 11. An electrically conductive layer 46 (such as the bottommost electrically conductive layer 46) laterally surrounds each tubular dielectric spacer 116 upon formation of the electrically conductive layers 46.

Figure 13:
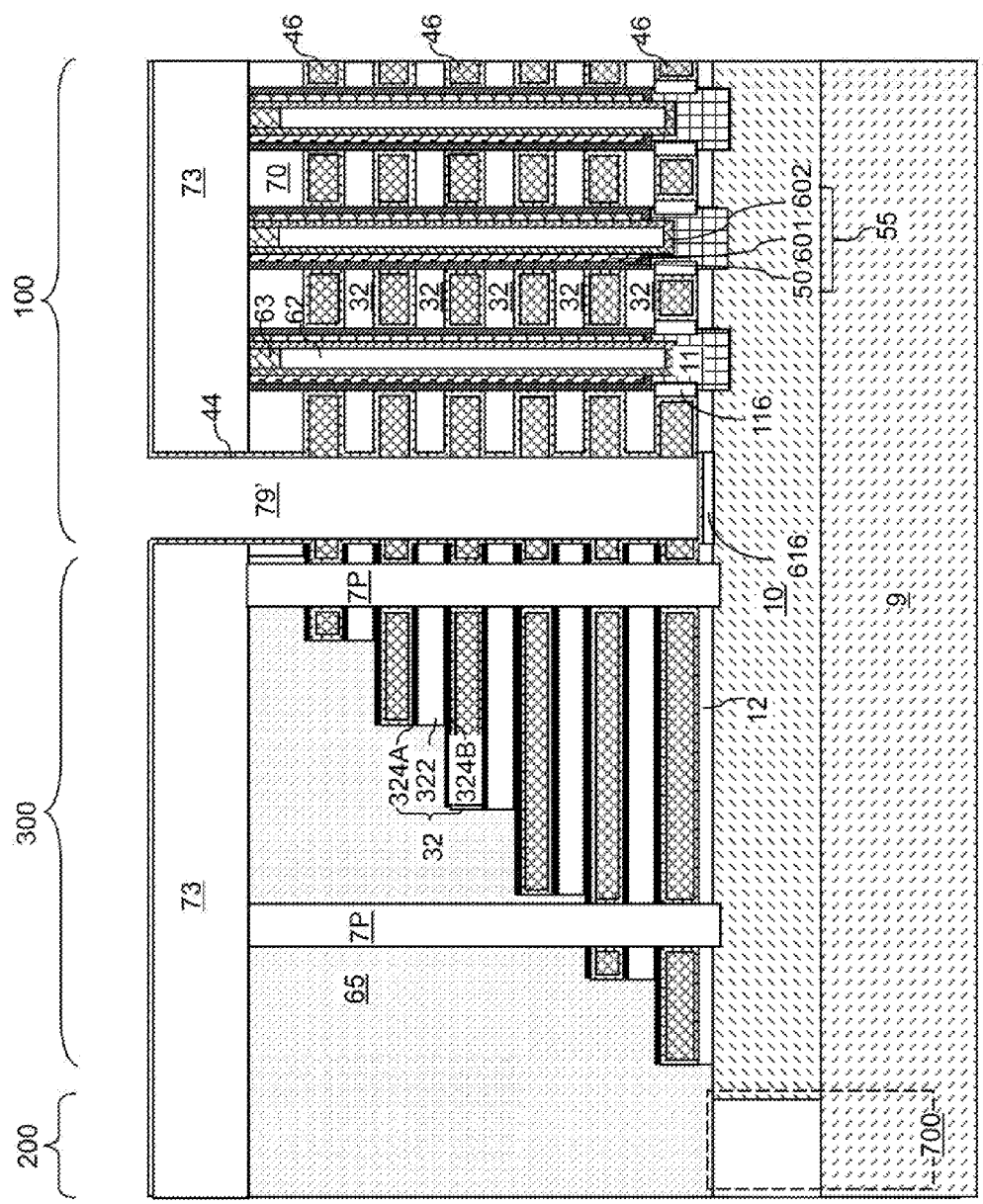
FIG. 13 is a schematic vertical cross-sectional view of the exemplary structure after removal of a deposited conductive material from within the backside trench according to an embodiment of the present disclosure.

Referring to FIG. 13, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. The electrically conductive layers 46 in the backside recesses are not removed by the etch process. In one embodiment, the sidewalls of each electrically conductive layer 46 can be vertically coincident after removal of the continuous electrically conductive material layer 46L.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 14:
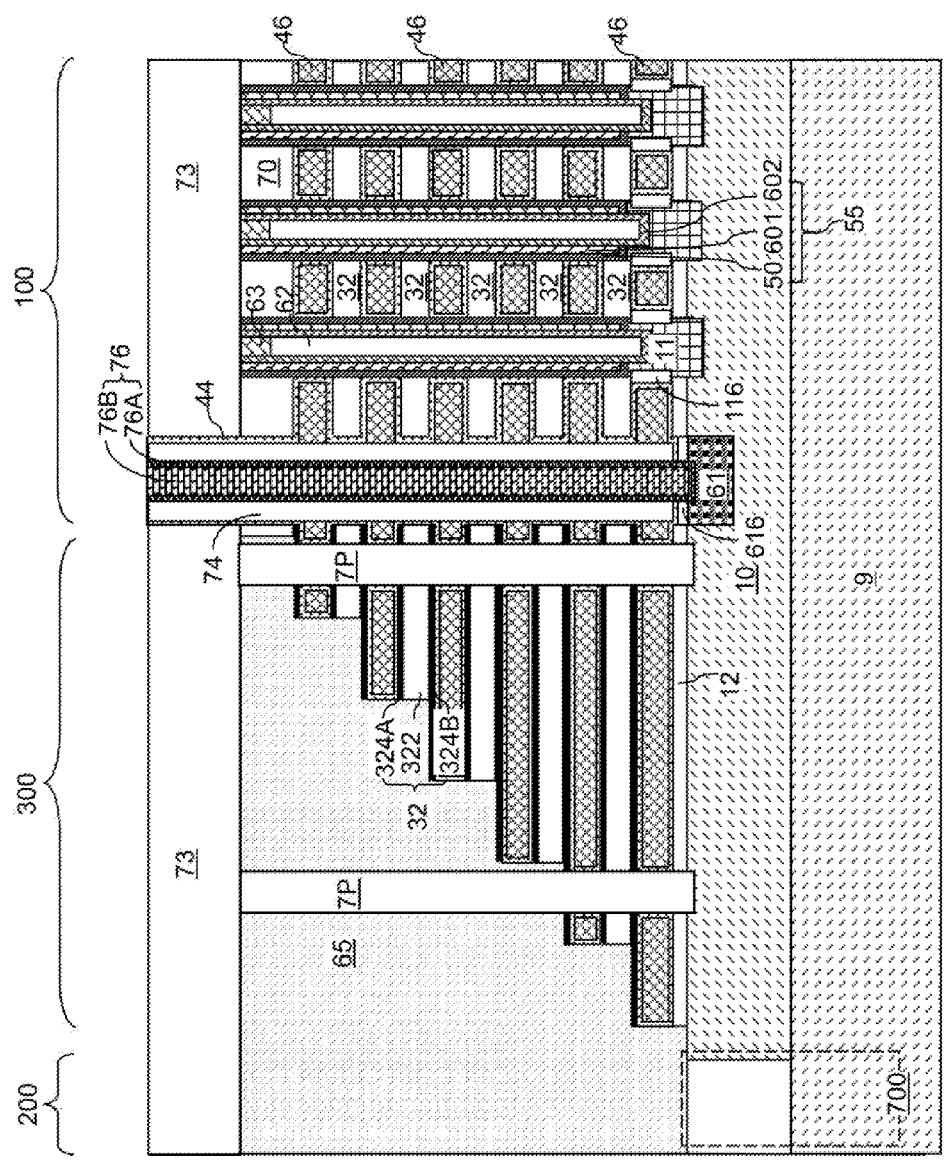
FIG. 14 is a schematic vertical cross-sectional view of the exemplary structure after formation of an insulating spacer and a backside contact structure according to an embodiment of the present disclosure.

Referring to FIG. 14, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicon oxide, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. An anisotropic etch is performed to remove horizontal portions of the insulating material layer from above the contact level dielectric layer 73 and at the bottom of each backside trench 79. Each remaining portion of the insulating material layer constitutes an insulating spacer 74. The anisotropic etch can continue to etch through physically exposed portions of the planar dielectric portion 616 in each backside trench 79. Each remaining portion of the planar dielectric portion 616 is herein referred to as an annular insulating spacer 616'. Thus, an insulating spacer 74 is formed in each backside trench 79 directly on physically exposed sidewalls of the electrically conductive layers 46.

A source region 61 can be formed underneath each backside trench 79 by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can contact a bottom surface of the insulating spacer 74.

A backside contact via structure 76 can be formed within each cavity 79'. Each contact via structure 76 can fill a respective cavity 79'. The backside contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. Each backside contact via structure 76 can be formed directly on a top surface of a source region 61. Each backside contact via structure 76 can contact a respective source region 61, and can be laterally surrounded by a respective insulating spacer 74.

Figure 15A:
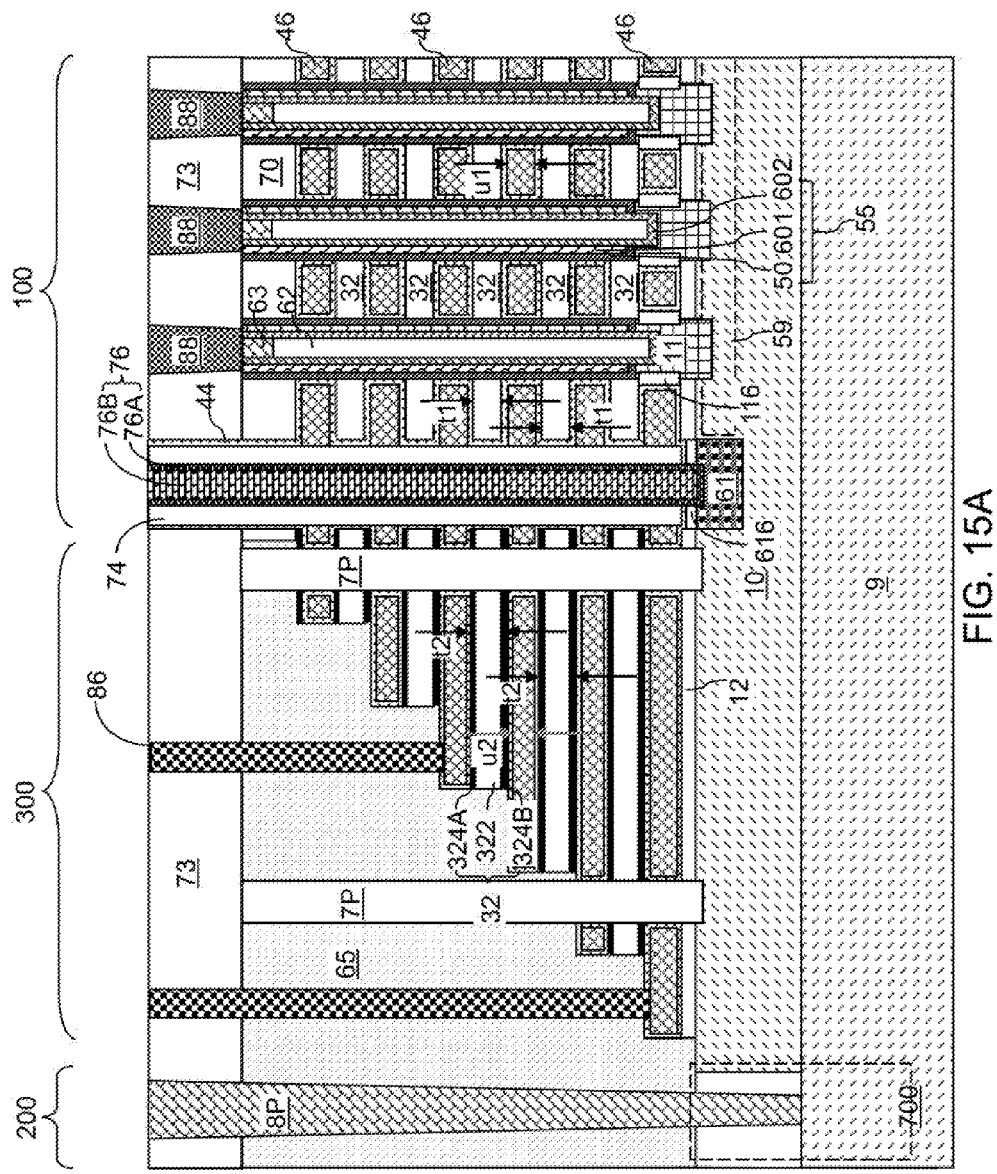
FIG. 15A is a schematic vertical cross-sectional view of the exemplary structure after formation of additional contact via structures according to an embodiment of the present disclosure.
Figure 15B:
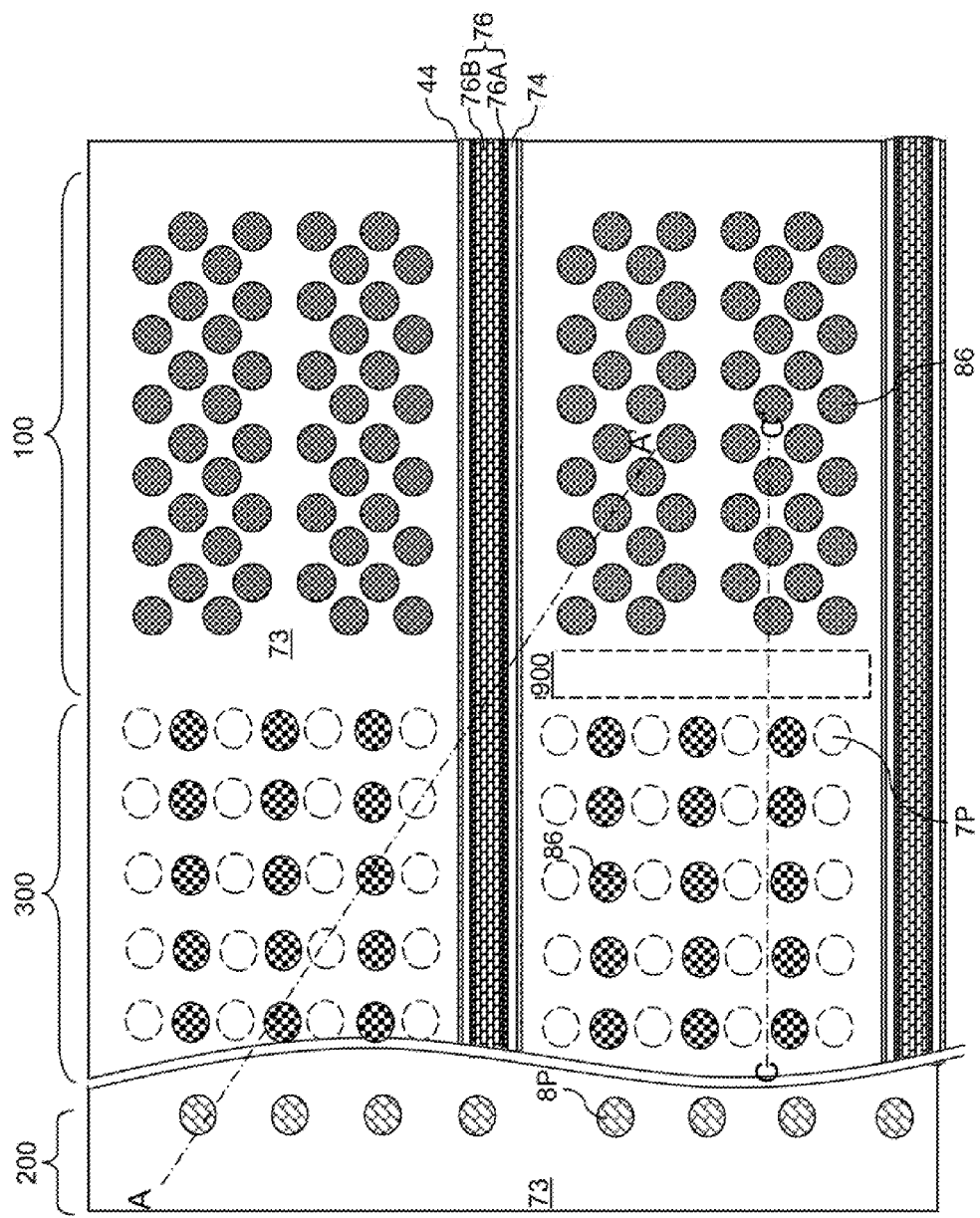
FIG. 15B is a top-down view of the exemplary structure of FIG. 15A. Plane A-A' is the plane of the vertical cross-sectional view of FIG. 15A. Plane C-C' is the plane of the vertical cross-sectional view of FIG. 15C.
Figure 15C:
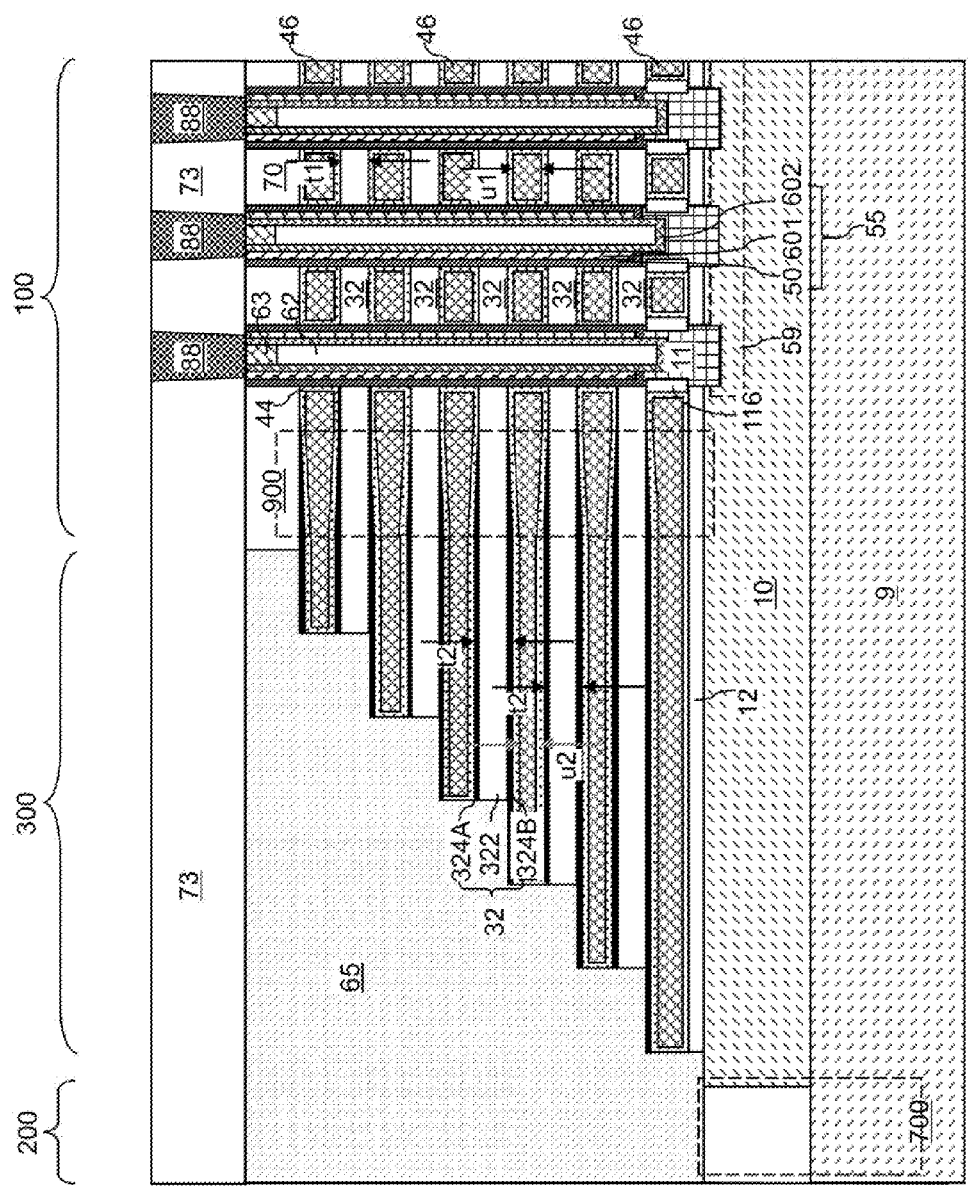
FIG. 15C is a schematic vertical cross-sectional view of the exemplary structure of FIGS. 15A and 15B.

Referring to FIGS. 15A-15C, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral contact via structures 8P can be formed through the retro-stepped dielectric material portion 65 directly on respective nodes of the peripheral devices.

The exemplary structure of the present disclosure can include a three-dimensional memory device. The three-dimensional memory device includes an alternating stack of insulating layers 32 and electrically conductive layers 46 located over a substrate (9, 10); memory stack structures 55 extending through a first region 100 of the alternating stack (32, 46), wherein each of the memory stack structures 55 comprises a memory film 50 and a vertical semiconductor channel 60; an support pillar structures 7P extending through a second region 300 of the alternating stack (32, 46) that is laterally offset from the first region 100. Each insulating layer 32 includes a respective first insulating material portion having a respective first insulator thickness t1 in the first region 100 of the alternating stack (32, 46) and a respective second insulating material portion having a respective second insulator thickness t2 that is greater than the respective first insulator thickness t1 in the second region 300.

In one embodiment, each electrically conductive layer 46 that is not the topmost layer or the bottommost layer of the alternating stack (32, 46) has a respective first conductor thickness u1 in the first region 100 of the alternating stack (32, 46) and a respective second conductor thickness u2 that is less than the respective first conductor thickness u1 in the second region 300 of the alternating stack (32, 46) In one embodiment, a difference between the first insulator thickness t1 and the second insulator thickness t2 is the same as a difference between the first conductor thickness u1 and the second conductor thickness u2.

In one embodiment, each second insulating material portion of the insulating layers 32 includes a first silicon oxide material portion 322, an upper second silicon oxide material portion 324A overlying the first silicon oxide material portion 322, and a lower second silicon oxide material portion 324B underlying the first silicon oxide material portion 322 in the second region 300. The first silicon oxide material portion 322 includes a first silicon oxide material, and the upper second silicon oxide material portion 324A and the lower second silicon oxide material portion 324B include a second silicon oxide material that is different from the first silicon oxide material. In one embodiment, the second silicon oxide material has a lower etch rate than the first silicon oxide material in a hot phosphoric acid solution including phosphoric acid at a concentration in a range from 80% to 94%.

In one embodiment, each of the upper second silicon oxide material portion 324A, the lower second silicon oxide material portion 324B, and the first silicon oxide material portion 322 physically contacts an element selected from a backside blocking dielectric layer 44 and the electrically conductive layers 46 within the alternating stack (32, 46).

In one embodiment, a thickness transition region 900 can be located between the first region 100 and the second region 300. Each of the insulating layers 32 can have a gradually varying thickness between the first region 100 and the second region 300. Each of the electrically conductive layers 46 can have a gradually varying thickness between the first region 100 and the second region 300.

In one embodiment, the second region 300 can comprise a terrace region in which each electrically conductive layer 46 other than a topmost electrically conductive layer 46 within the alternating stack (32, 46) laterally extends farther than any overlying electrically conductive layer 46 within the alternating stack (32, 46). The terrace region includes stepped surfaces of the alternating stack (32, 46) that continuously extend from a bottommost layer within the alternating stack (32, 46) to a topmost layer within the alternating stack (32, 46).

In one embodiment, the support pillar structures 7P comprise respective dielectric material portions contacting the substrate (9, 10) and laterally surrounded by at least one electrically conductive layer 46 within the alternating stack (32, 46).

The three-dimensional memory device can include a backside trench 79 extending through the alternating stack (32, 46); an insulating spacer 74 located at a periphery of the backside trench 79; a source region 61 located in an upper portion of the substrate (9, 10) and underlying the backside trench 79; and a backside contact via structure 76 contacting the source region 61 and laterally surrounded by the insulating spacer 74.

In one embodiment, the three-dimensional memory device comprises a vertical NAND device located over the substrate (9, 10); the electrically conductive layers 46 comprise, or are electrically connected to, a respective word line of the NAND device; the substrate (9, 10) comprises a silicon substrate; the vertical NAND device comprises an array of monolithic three-dimensional NAND strings over the silicon substrate; at least one memory cell in a first device level of the array of monolithic three-dimensional NAND strings is located over another memory cell in a second device level of the array of monolithic three-dimensional NAND strings; and the silicon substrate contains an integrated circuit comprising a driver circuit for the memory device located thereon. The array of monolithic three-dimensional NAND strings can comprise: a plurality of semiconductor channels (60, 11, and a surface portion of the semiconductor material layer between the source region 61 and the epitaxial channel portions 11). At least one end portion of each of the plurality of semiconductor channels extends substantially perpendicular to a top surface of the substrate (9, 10). The electrically conductive layers 46 can comprise a plurality of control gate electrodes having a strip shape extending substantially parallel to the top surface of the substrate (9, 10). The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as portions of the charge storage layer 54 that are located at each level of the electrically conductive layers 46). Each charge storage element can be located adjacent to a respective one of the plurality of semiconductor channels (59, 11, 60).

The three-dimensional memory device of the present disclosure includes thickness-modulated electrically conductive layers 46 and thickness-modulated insulating layers 32 such that the alternating stack (32, 46) has the same pitch throughout. The thickness-modulated electrically conductive layers 46 have a greater thickness in the memory device region 100 than in the contact region 300 in order to provide greater electrical conductivity to the electrically conductive layers 46, which function as control gate electrodes. The thickness-modulated insulating layers 32 have a greater thickness in the contact region 300 than in the memory device region 100 in order to provide greater mechanical strength to the exemplary structure while the sacrificial material layers 42 are removed, thereby preventing collapse of the exemplary structure in the contact region 300 at the processing steps of FIG. 11. Areal confinement of formation of the modified silicon oxide material portions (324A, 324B) within the contact region 300 in combination with a higher etch resistance and/or presence of the modified silicon oxide material portions (324A, 324B) than the silicon oxide material as initially deposited enables formation of backside recesses 43 with differential heights. The differential heights of the backside recesses 43 are advantageously employed to form thickness-modulated electrically conductive layers 46 of the present disclosure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate;
memory stack structures extending through a first region of the alternating stack, wherein each of the memory stack structures comprises a memory film and a vertical semiconductor channel; and
support pillar structures extending through a second region of the alternating stack that is laterally offset from the first region,
wherein each insulating layer includes a respective first insulating material portion having a respective first insulator thickness in the first region of the alternating stack and a respective second insulating material portion having a respective second insulator thickness that is greater than the respective first insulator thickness in the second region.

2. The three-dimensional memory device of claim 1, wherein each electrically conductive layer that is not the topmost layer or the bottommost layer of the alternating stack has a respective first conductor thickness in the first region of the alternating stack and a respective second conductor thickness that is less than the respective first conductor thickness in the second region of the alternating stack.

3. The three-dimensional memory device of claim 2, wherein a difference between the first insulator thickness and the second insulator thickness is the same as a difference between the first conductor thickness and the second conductor thickness.

4. The three-dimensional memory device of claim 1, wherein each second insulating material portion of the insulating layers includes a first silicon oxide material portion, an upper second silicon oxide material portion overlying the first silicon oxide material portion, and a lower second silicon oxide material portion underlying the first silicon oxide material portion in the second region.

5. The three-dimensional memory device of claim 1, wherein:
the first silicon oxide material portion includes a first silicon oxide material; and
the upper second silicon oxide material portion and the lower second silicon oxide material portion include a second silicon oxide material that is different from the first silicon oxide material in at least one of composition and structure.

6. The three-dimensional memory device of claim 5, wherein the second silicon oxide material has a lower etch rate than the first silicon oxide material in a hot phosphoric acid solution including phosphoric acid at a concentration in a range from 80% to 94%.

7. The three-dimensional memory device of claim 6, wherein each of the upper second silicon oxide material portion, the lower second silicon oxide material portion, and the first silicon oxide material portion physically contacts an element selected from a backside blocking dielectric layer and the electrically conductive layers within the alternating stack.

8. The three-dimensional memory device of claim 1, further comprising a thickness transition region located between the first region and the second region, wherein:
each of the insulating layers has a gradually varying thickness between the first region and the second region; and
each of the electrically conductive layers has a gradually varying thickness between the first region and the second region.

9. The three-dimensional memory device of claim 1, wherein the second region comprises a terrace region in which each electrically conductive layer other than a topmost electrically conductive layer within the alternating stack laterally extends farther than any overlying electrically conductive layer within the alternating stack, wherein the terrace region includes stepped surfaces of the alternating stack that continuously extend from a bottommost layer within the alternating stack to a topmost layer within the alternating stack.

10. The three-dimensional memory device of claim 1, wherein the support pillar structures comprise respective dielectric material portions contacting the substrate and laterally surrounded by at least one electrically conductive layer within the alternating stack.

11. The three-dimensional memory device of claim 1, further comprising:
a backside trench extending through the alternating stack;
an insulating spacer located at a periphery of the backside trench;
a source region located in an upper portion of the substrate and underlying the backside trench; and
a backside contact via structure contacting the source region and laterally surrounded by the insulating spacer.

12. The three-dimensional memory device of claim 1, wherein:
the three-dimensional memory device comprises a vertical NAND device located over the substrate;
the electrically conductive layers comprise, or are electrically connected to, a respective word line of the NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate; and
a plurality of charge storage elements, each charge storage element located adjacent to a respective one of the plurality of semiconductor channels.

* * * * *